United States Patent
Lee

(10) Patent No.: US 9,183,940 B2
(45) Date of Patent: Nov. 10, 2015

(54) LOW DISTURBANCE, POWER-CONSUMPTION, AND LATENCY IN NAND READ AND PROGRAM-VERIFY OPERATIONS

(71) Applicant: Peter Wung Lee, Saratoga, CA (US)

(72) Inventor: Peter Wung Lee, Saratoga, CA (US)

(73) Assignee: APLUS FLASH TECHNOLOGY, INC., Fremont, CA (US)

( * ) Notice: Subject to any disclaimer, the term of this patent is extended or adjusted under 35 U.S.C. 154(b) by 4 days.

(21) Appl. No.: 14/283,209

(22) Filed: May 20, 2014

(65) Prior Publication Data

US 2014/0347928 A1 Nov. 27, 2014

Related U.S. Application Data

(60) Provisional application No. 61/825,996, filed on May 21, 2013.

(51) Int. Cl.
| | |
|---|---|
| *G11C 16/04* | (2006.01) |
| *G11C 16/26* | (2006.01) |
| *G11C 16/10* | (2006.01) |
| *G11C 16/34* | (2006.01) |
| *G11C 11/56* | (2006.01) |

(52) U.S. Cl.
CPC ............ *G11C 16/26* (2013.01); *G11C 11/5628* (2013.01); *G11C 16/0483* (2013.01); *G11C 16/10* (2013.01); *G11C 16/3418* (2013.01)

(58) Field of Classification Search
USPC ............. 365/185.03, 185.17, 189.05, 230.08, 365/207
See application file for complete search history.

(56) References Cited

U.S. PATENT DOCUMENTS

| | | | |
|---|---|---|---|
| 5,734,609 | A | 3/1998 | Choi et al. |
| 5,867,429 | A | 2/1999 | Chen et al. |
| 6,522,580 | B2 | 2/2003 | Chen et al. |
| 6,542,407 | B1 | 4/2003 | Chen et al. |
| 6,657,891 | B1 | 12/2003 | Shibata |
| 6,781,877 | B2 | 8/2004 | Cernea |
| 6,807,095 | B2 | 10/2004 | Chen |
| 6,816,409 | B2 | 11/2004 | Tanaka |
| 6,847,553 | B2 | 1/2005 | Chen |

(Continued)

OTHER PUBLICATIONS

Tae-Sung Jung, "A 3.3V 128Mb Multi-Level NAND Flash Memory for Mass Storage Applications", Digest of Technical Papers. 42nd ISSCC. 1996 IEEE International, Feb. 10, 1996, p. 32-33. IEEE J. Solid-State Circuits.

(Continued)

*Primary Examiner* — Pho M Luu
(74) *Attorney, Agent, or Firm* — Raywell Group, LLC

(57) ABSTRACT

A HiNAND array with a hierarchical-BL scheme configured to divide a large global bit line (GBL) capacitance into J number of small local bit line (LBL) capacitances for reducing bit line precharge voltage and discharge time to achieve faster Read and Program-Verify speed, lower power consumption, lower latency, and lower word line disturbance for a reliable DRAM-like latch sensing. A reduced precharge voltage can be increased by M-fold (M≥2) using a Multiplier between each bitline and each Latch sense amplifier (SA). Between each Multiplier and each Latch SA, there is a Connector with two optional designs for either fully passing a sense voltage to the Latch SA with a same-polarity and value or reversing the polarity the sensing voltage with additional amplification. The Latch SA is configured to transfer stored threshold states of a memory cell into a bit of a page buffer.

33 Claims, 15 Drawing Sheets

(56) References Cited

U.S. PATENT DOCUMENTS

| | | | |
|---|---|---|---|
| 6,870,768 B2 | 3/2005 | Cernea | |
| 6,888,758 B1 | 5/2005 | Hemink | |
| 6,917,542 B2 | 7/2005 | Chen | |
| 7,023,735 B2 | 4/2006 | Ban | |
| 7,046,548 B2 | 5/2006 | Cernea | |
| 7,061,798 B2 | 6/2006 | Chen | |
| 7,102,924 B2 | 9/2006 | Chen | |
| 7,187,585 B2 | 3/2007 | Li | |
| 7,196,928 B2 | 3/2007 | Chen | |
| 7,224,613 B2 | 5/2007 | Chen | |
| 7,262,994 B2 | 8/2007 | Fong | |
| 7,289,344 B2 | 10/2007 | Chen | |
| 7,301,808 B2 | 11/2007 | Li | |
| 7,301,813 B2 | 11/2007 | Chen | |
| 7,301,839 B2 | 11/2007 | Li | |
| 7,310,275 B2 * | 12/2007 | Cha | 365/189.05 |
| 7,315,477 B2 | 1/2008 | Chen | |
| 7,321,510 B2 | 1/2008 | Li | |
| 7,372,730 B2 | 5/2008 | Chen | |
| 7,397,698 B2 | 7/2008 | Fong | |
| 7,440,318 B2 | 10/2008 | Fong | |
| 7,443,729 B2 | 10/2008 | Li | |
| 7,499,329 B2 | 3/2009 | Nazarian | |
| 7,499,338 B2 | 3/2009 | Ito | |
| 7,506,113 B2 | 3/2009 | Li | |
| 7,522,454 B2 | 4/2009 | Li | |
| 7,570,517 B2 | 8/2009 | Kwak | |
| 7,652,929 B2 | 1/2010 | Li | |
| 7,839,690 B2 | 11/2010 | Lee | |
| 7,876,611 B2 | 1/2011 | Dutta | |
| 8,036,041 B2 | 10/2011 | Li | |
| 8,130,556 B2 | 3/2012 | Lutze | |
| 8,218,348 B2 | 7/2012 | Roohparvar | |
| RE43,665 E | 9/2012 | Moschiano | |
| 8,274,823 B2 | 9/2012 | Roohparvar | |
| 8,284,606 B2 | 10/2012 | Li | |
| 8,284,613 B2 | 10/2012 | Yamada | |
| 8,289,764 B2 * | 10/2012 | Hanzawa | 365/163 |
| 8,355,287 B2 * | 1/2013 | Hsu et al. | 365/185.22 |
| 8,400,826 B2 | 3/2013 | Roohparvar | |
| 8,400,839 B2 | 3/2013 | Li | |
| 8,446,777 B2 | 5/2013 | Ueno | |
| 8,462,559 B2 | 6/2013 | Yamada | |
| 8,477,533 B2 | 7/2013 | Kang | |
| 8,503,230 B2 | 8/2013 | Yoo | |
| 8,503,245 B2 | 8/2013 | Yamada | |
| 8,526,236 B2 | 9/2013 | Jones | |
| 8,559,222 B1 | 10/2013 | Iwai et al. | |
| 8,559,236 B2 | 10/2013 | Nakai | |
| 8,570,810 B2 | 10/2013 | Fong | |
| 8,599,617 B2 | 12/2013 | Shiino | |
| 8,605,503 B2 | 12/2013 | Futatsuyama | |
| 8,605,511 B2 | 12/2013 | Tanaka | |
| 8,619,468 B2 | 12/2013 | Shibata | |
| 8,625,356 B2 | 1/2014 | Shibata | |
| 8,625,357 B2 | 1/2014 | Cho | |
| 8,625,359 B2 | 1/2014 | Jeon | |
| 8,630,115 B2 | 1/2014 | Pascucci | |
| 8,630,116 B2 | 1/2014 | Maejima | |
| 8,634,251 B2 | 1/2014 | Chung | |
| 8,637,915 B2 | 1/2014 | Ichige | |
| 8,638,608 B2 | 1/2014 | Lai | |
| 8,638,609 B2 | 1/2014 | Lin | |
| 8,644,081 B2 | 2/2014 | Chang | |
| 8,654,585 B2 | 2/2014 | Oh | |
| 8,654,588 B2 | 2/2014 | Aritome | |
| 8,659,951 B2 | 2/2014 | Nawata | |
| 8,661,294 B2 | 2/2014 | Lee | |
| 8,665,649 B2 | 3/2014 | Park | |
| 8,670,272 B2 | 3/2014 | Radke | |
| 8,675,416 B2 | 3/2014 | Lee | |
| 8,681,543 B2 | 3/2014 | Lee et al. | |
| 8,681,545 B2 | 3/2014 | Kim et al. | |
| 8,681,563 B1 | 3/2014 | Lee | |
| 8,687,430 B2 | 4/2014 | Sarin et al. | |
| 8,687,431 B2 | 4/2014 | Sarin | |
| 8,694,720 B2 | 4/2014 | Lee | |
| 8,694,766 B2 | 4/2014 | Toelkes | |
| 8,700,879 B2 | 4/2014 | Porzio | |
| 8,705,277 B2 | 4/2014 | Moschiano et al. | |
| 8,705,290 B2 | 4/2014 | Damle | |
| 8,705,293 B2 | 4/2014 | She | |
| 8,711,621 B2 | 4/2014 | Kim | |
| 8,711,624 B2 | 4/2014 | Choi | |
| 8,717,819 B2 | 5/2014 | Aritome | |
| 8,730,733 B2 | 5/2014 | Youn | |
| 8,737,140 B2 | 5/2014 | Kim | |
| 8,755,224 B2 | 6/2014 | Yun | |
| 8,773,910 B2 | 7/2014 | Jones | |
| 8,773,911 B2 | 7/2014 | Park | |
| 8,893,247 B1 | 11/2014 | Faaborg | |
| 9,001,545 B2 * | 4/2015 | Lee | 365/49.1 |
| 9,019,764 B2 * | 4/2015 | Lee et al. | 365/185.11 |
| 2015/0078080 A1 * | 3/2015 | Lee | 365/185.03 |

OTHER PUBLICATIONS

June Lee, "A 1.8V 2Gb NAND Flash Memory for Mass Storage Applications", Digest of Technical Papers. ISSCC. 2003 IEEE International, Feb. 13, 2003, p. 290-494. vol. 1, IEEE J. Solid-State Circuits.

* cited by examiner

LOW DISTURBANCE, POWER-CONSUMPTION, AND LATENCY IN NAND READ AND PROGRAM-VERIFY OPERATIONS

1. CROSS-REFERENCES TO RELATED APPLICATIONS

This application claims priority to U.S. Provisional Application No. 61/825,996, filed May 21, 2013, commonly assigned and incorporated by reference herein for all purposes.

Additionally, this application is related to U.S. Pat. Nos. 7,440,318, 7,570,517, RE43,665 E, and 7,262,994, which are incorporated by reference herein for all purposes.

This application is further related to an article titled "A 3.3V 128 Mb Multi-Level NAND Flash Memory for Mass Storage Applications" by Tae-Sung Jung, etc., Samsung Electronics, Solid-State Circuits Conference, Feb. 10, 1996. Digest of Technical Papers. 42nd ISSCC. 1996 IEEE International, page 32-33; and an article titled "A 1.8V 2 Gb NAND Flash Memory for Mass Storage Applications" by June Lee, etc., Samsung Electronics, Solid-State Circuits Conference, Feb. 13, 2003. Digest of Technical Papers. ISSCC. 2003 IEEE International. Page 290-494 Vol. 1.

2. BACKGROUND OF THE INVENTION

This invention relates generally to memory architecture for improving NAND Read operation. More specifically, various embodiments of the present invention provide a NAND Read scheme for drastic reduction over the high WL-disturbance, high BL-precharge power consumption, and high latency issues in an extremely high-density NAND (HiNAND) memory array, regardless of data storage types such as SLC, MLC, TLC, XLC or Analog storages, regardless of 2-poly floating-gate NAND cell or 1-poly charge-trapping MONOS or SONOS cell, regardless of NMOS cell or PMOS cell, regardless of 2D or 3D NAND technologies.

Nonvolatile memory (NVM) is well known in the art. NVMs that provide the in-system or in-circuit repeatedly electrically programmable and erasable functions today include three major standalone NVMs such as EEPROM, NOR, and NAND Flash Memory and one Embedded Flash, eFlash, memory. All above four NVMs are based on varied technologies.

The EEPROM is suitable for the Byte-alterable Data storage with the highest density below 4 Mb at 0.13 µm node. The NOR flash is suitable for the block-alterable Code storage with the highest density below 8 Gb at 45 nm node. The eFlash is suitable for the page-alterable Code storages with the highest density below 64 Mb at 65 nm node. Lastly, NAND flash is suitable for the sector-alterable Data storage with the highest density below 256 Gb at 19 nm node in MLC storage.

Currently, NAND flash memory has achieved the highest scalability, density and smallest feature of 1× nm node in 2012. The mainstream standalone NAND in mass production is mainly based on 2-poly floating-gate NMOS device, which employs 20V but the extremely low current FN channel-erase and FN channel-program schemes. The NAND flash device and cell array comprises a plurality of NAND Strings that are organized in a matrix with a plurality of rows and columns. Each String is further comprised of a plurality of NMOS NAND cells connected in series sandwiched by two NMOS 1-poly String-select transistors located on top and bottom of a NAND String. The number of NAND flash cells in one String can be made of 8, 16, 32, 64, 128 or arbitrary integer number, depending on NAND density requirement and applications.

Each NAND cell has several different types of storages that include SLC (1 bit per cell), MLC (2 bits per cell), TLC (3 bits per cell), XLC (4 bits per cell) and even Analog storage that stores more than 4 bits.

In three key operations of prior-art NAND such as Erase, Program and Read, of which require either verification in both Erase and Program operations or Read to ensure the desired data or NAND cell's threshold state Vt have been accurately programmed and erased into the selected NAND flash cells in the right locations in accordance with the desired values, storage types and time specs by checking or reading out the selected cells' Vt after Erase and Program operations.

In the specification, a 2-poly NAND array comprising a plurality of 32T NAND-Strings is assumed and used as an example to describe both the conventional NAND Read operation and a HiNAND Read operation based on the present invention, although other String sizes (8, 16, 64, 128, etc.) can be applied. When programming NAND cells in the same selected WL, FN-channel scheme is commonly used for Erase and Program operations. In a typical NAND Program operation, a high step-rising program voltage, Vpgm from 15V to 25V, is applied to one selected WLn but a Vpass (program) of around 10V is applied to the rest of 31 non-selected WLs in the selected Strings along with the gate of bottom String-select transistor connected to Vss and the gate of top String-select transistor connected to Vdd.

As a result, 31 NAND cells in the same String are in conduction-state while the String's bit line is grounded. The plurality of electrons from the selected NAND cells' channels are injected into the floating gate layer, Poly1, and NAND cells' threshold voltage, Vt, are raised from an erased Vt0, E-state, with a negative value to a desired positive value of Vt1, which is referred as a programmed state, A-state.

Similarly, when programming a 1-poly NAND flash device using same FN-channel scheme, a similar step-rising high program voltage, Vpgm, is also applied to the selected 1-poly NAND's control gate with its bit line is grounded. This Vpgm voltage can be same or lower than the Vpgm applied to the above 2-poly NAND flash memory, depending on the coupling ratio from Poly gate to Nitride layer. Electrons from 1-poly NAND cell's channel are then injected into its charge-trapping layer. The step-rising Vpgm voltage is typically set to be between 15V to 25V with a typical increment of ΔVpgm, ranging from 0.2V to 0.4V.

More information about the programming methods can be found in U.S. Pat. No. 6,859,397, titled "Source Side Boosting Technique for Non-volatile Memory;" and U.S. Pat. No. 6,917,542, titled "Detecting Over Programmed Memory;" and U.S. Pat. No. 6,888,758, titled "Programming Non-Volatile Memory," which are incorporated as references herein.

In many cases, Vpgm pulse is applied to the selected WLn of NAND associated with several MHV pass-WL voltages such as Vpass(program) voltages such as Vpass1, Vpass2 and others applied to the non-selected WLn−1 and WLn+1 and the rest of WLn in the selected NAND strings of the selected blocks.

A series of Vpgm pulses (referred to as the programming gate pulses), with the magnitude of the pulses increasing are applied to WLn. Between each rising-step Vpgm pulse, a set of single or multiple program verify pulses like Read operation are performed to determine whether the selected NAND cells(s) in the selected page or WL are being programmed into the desired programmed Vtn values. The programmed Vtn values are determined by the type of storages such as SLC (1-bit per cell), MLC (2-bit per cell), TLC (3-bit per cell), XLC (4-bit per cell) or Analog storage (more than 4-bit per cell).

Since Program-Verify operation is like the regular Read operation, the previously mentioned BL-precharge cycle and discharge cycle would be the same. Therefore, during each Program-Verify cycle, a NAND flash memory has to pre-charge all long BLs' large capacitance from Vss to $V_{BL}$ as described before. As a result, a large BL precharge current occurs and the large Vpass(read) 6V WL disturbance will be induced on NAND cell. In addition, Program-Verify cycle also has a long latency as Read due to the discharge process starts from a high value of $V_{BL}$, which ranges from 0.8V to Vdd in today's NAND design.

If any of the selected NAND cells have reached their targeted programmed Vts as determined in Program-Verify step, then the further programs have to be stopped on those NAND cells to avoid or inhibit over-programming into next higher wrong Vt state. For those NAND cells' Vt that do not reach the desired value after Program-Verify operation, then the Vpgm pulses continue applying to those NAND cells in the selected page or WL associated with Vpass of 10V or other HV to the non-selected WLs. If the desired Vts are not reached, then the iterative programming and verify pulses would be repeatedly applied to those cells. Until all NAND cells in the selected page have been programmed successfully into the desired Vt states, then the programming and Program-Verify operations of the selected page would be stopped. The Program and Program-Verify operations would be continued on those remaining pages in the preferred sequence from String bottom to the string top in the selected strings of the selected blocks of the NAND memory. As the Program and Program-Verify operation repeats, the BL pre-charge current and Vpass WL-induced disturbance will be multiplied.

Typically, each NAND String physically comprises 16, 32, 64, or even 128 WLs and the MLC page number is doubled to SLC page number, TLC density is tripled and XLC density is quadrupled.

A multi-state NAND memory device stores multiple bits of data per NAND cell by differentiating multiple distinct valid Vtn distributions separated by some preferred forbidden ranges such as $\Delta$Vtn. Each distinct Vtn has a distribution between $Vtn_{max}$ and $Vtn_{min}$. Each $\Delta$Vtn is defined to be a value of $Vtn_{min}$ of a higher-level state minus the $Vtn_{max}$ of a lower-level state. Each Vtn is defined corresponding to a predetermined value for the set of data bits encoded in NAND device.

As the number of bits of data per NAND cell is increased from SLC to MLC, TLC, and XLC, the number of valid Vtn are increased from 2 to 4, 8 and 16. As a result, the NAND data capacity is drastically increased, thus the die cost is greatly reduced.

There is a tradeoff. When each NAND cell storage capacity is programmed to increase, however, the programming time also increases and NAND cell's data reliability greatly degrades accordingly. In some applications, the increased programming time and the lower data reliability cannot be accepted.

But for this invention, we will look into more into the NAND Read and Program-Verify disturbance and precharge BL current consumption issues.

Why does a regular NAND Read operation consume so much power? This is due to the fundamentals of the NAND sensing scheme. Firstly, to read or verify a stored Vt out from a selected NAND cell in the selected NAND string and in a selected page (WLn), today's NAND scheme pre-charges each BL from Vss to a value of $V_{BL}$ first because the resistance of the NAND string is larger than 1 M-ohms if the sensing current is less than 1 μA. Later, to distinguish the NAND cell's Vt, it is determined by reading the final $V_{BL}$ voltage against the $V_{RD}$ in the selected WL. If $V_{BL}$ is discharged to Vss, then NAND cell Vt=$V_{RD}$. If $V_{BL}$ is not discharged and retains the initial pre-charged $V_{BL}$, then the NAND cell's Vt is higher than $V_{RD}$ applied on the selected WL. The Read operation of getting the right NAND Vt has to be continued until a new value of $V_{RD}$ is found to discharge the initial $V_{BL}$ to Vss.

In prior-art NAND array architecture, each BL is connected to a plurality of NAND Strings by a long metal line such as metal1 line running in Y-direction with a capacitance value of around 3-5 pf. The $V_{BL}$ value ranges from 0.8V to Vdd. With a lower $V_{BL}$ value, less number of BLs and a shorter BL metal1 line length would reduce each BL and total BL capacitances, thus reducing total each and total BL precharge current in NAND Read and Verification cycles.

In one option of the conventional NAND array, the whole physical BLs in one physical page of the NAND array are being commonly divided into two sub-pages such as the odd page and the even page with half of whole BLs. In another option of the conventional NAND, the whole BLs in NAND array are read out simultaneously without being divided into the odd and even pages for less WL-disturbance and it was referred as All-BL Read or All-BL Verify. The total numbers of BLs in each NAND's physical page today can be as high as 8 KB or 65,536, not including the spare BLs for ECC syndrome bytes storage. For example, one NAND page size of 512B requiring extra 16B to store the regular NAND data and ECC spared data respectively. Each BL is connected to a plurality of NAND Strings by a metal, such as metal1 line, with a capacitance value around 3-5 pf, in NAND density above 16 Gb. In a NAND technology node above 4× nm, the BL capacitance mainly attribute to two factors. The first factor is the area of BL metal1 overlaps the flash cells and Strings that are formed in a triple P-well within the Deep N-well on top of P-substrate. The second factor is the $N^+$/P junction capacitance occurs at each NAND String's contact areas. Since only one contact is shared by two long NAND Strings in Y-direction, the number of $N^+$/P Contacts and its capacitance is much smaller than the BL-long metal1 line. Thus, $N^+$/P capacitance is negligible as compared to BL metal1.

When scaling down below 3× nm node, the BL metal1 proximity effect in NAND flash array layout will induce a significant parasitic capacitance between two adjacent BLs. As a result in nGb-density NAND array, each BL will bear a long metal1 BL with a large capacitance comprising over metal1 overlapping area to flash cells on p-substrate and coupling parasitic BL capacitance due to the BL-proximity effect.

During a NAND Read or Program- and Erase-Verification operations, all BLs or one-half of BLs such as odd and even BLs have to be pre-charged from Vss to a desired high value, ranging from 0.8V to Vdd. This precharge operation is done on maximum 8 KB BLs as defined in one physical page. The total precharge current=N×Vdd×$CAP_{BL}$/Pre-charge time, where N is the number of total BLs. The value of N is 65,536 for 8 KB page and $CAP_{BL}$ is 3 pf. The typical BL precharge time was designed to be around 10 μS today. As a result, a total peak precharge BL current of more than 100 mA will occur in each Read or each Verification cycle. This huge GBL precharge current needs to be reduced for a longer storage for battery-driven handheld mobile NAND.

Secondly, a Read-induced or Verify-induced WL-disturbance in NAND flash memory is also frequently encountered during the regular Read and Verify operations and becomes worsen after repeated Read and Verify operations in prior-art NAND flash memory. Just a repeated reading and verification of NAND can quickly corrupt the stored data in each NAND flash cell. Although this corrupted data can be fixed by using a more sophisticated ECC algorithm of flash controller, NAND flash memory will be rendered useless when the Read-induced and Verify-induced errors are too high beyond ECC's fixing capability.

Why a regular Read and Verify operations has induced severe WL-disturbance issue in prior-art NAND flash memory? It is again due to NAND's unique structure in each NAND String. To read the selected cell of each String, the non-selected NAND cells with different stored Vts have to be all in the conduction state. To ensure all of these 31 non-selected NAND cells in a 32T NAND string, the 31 non-selected WLs have to be coupled with a MHV Vpass(read) voltage of around 6.0V, which is higher than the maximum stored Vt of around 4.0V. This Vpass(read) voltage on top gate would couple to the poly1 floating gate of nitride charge layer to attract the electronics from NAND cell's channel. This is like a soft-writing of the NAND cell. As a result, each NAND's Vt would be gradually increased when Read cycles increases.

Take the Read operation of a NAND array comprising a plurality of 32T-strings as an example. The only one selected WL voltage is coupled with one or several preferred $V_{RD}$ voltages but the rest of 31 non-selected WLs and two top and bottom string-select NMOS transistors are coupled with a MHV voltage, Vpass(read). MHV stands for a medium high voltage around 6.0V.

For example, a SLC Read and Verify operations, only one $V_{RD}$ value is needed, $V_{RD}$=0V, to distinguish the erased state of a negative Vt0≤−0.7V with data "1" from the programmed positive Vt1≥1.0V with a data "0". In this SLC Read operation, only one BL-precharge cycle is required, thus one huge BL precharge current happens.

For a MLC Read operation, three $V_{RD}$ values of $V_{RD1}$=0V, $V_{RD2}$=1.5V, $V_{RD3}$=3.0V are required to distinguished one erased state and three program states such as Vt0 (E-state, 11), Vt1 (A-state, 01), Vt2 (B-state, 00) and Vt3 (C-state, 10), where Vt0<Vt1<Vt2<Vt3. In this MLC Read operation, still only one BL-precharge cycles is required by using the step-rise three $V_{RD}$ voltages to read four logic data with stored Vts. In other words, a MLC Read operation consumes one BL pre-charge current as a SLC Read operation.

Similarly, for a TLC Read operation, there are seven $V_{RD}$ values to distinguish one erased negative-Vt state, Vt0 from the remaining seven programmed positive-Vt states such as Vt1, Vt2, Vt3, Vt4, Vt5, Vt6, and Vt7. A similar step-rise $V_{RD}$ can be applied to the selected WL but still only one BL-precharge current happens in whole TLC Read cycle.

Additionally, for a XLC Read operation, there are fifteen $V_{RD}$ values to distinguish one erased negative-Vt state, Vt0 and remaining fifteen programmed positive-Vt states such as Vt1, Vt2, Vt3, Vt4, Vt5, Vt6, Vt7, Vt8, Vt9, Vt10, Vt11, Vt12, Vt13, Vt14, and Vt15. A similar step-rise $V_{RD}$ can be applied to the selected WL but still only one BL-precharge current happens in whole XLC Read cycle.

All non-selected 31 WLs and two String-select transistors of the selected NAND Strings are applied with a MHV voltage, Vpass(read). The reason is to turn these 31 NAND flash cells into a conduction state to allow the accurate Vt differentiation of one selected NAND cell in the selected WL. Since the maximum program Vtn is set to be around 4.0V, thus Vpass(read) 6.0V is required to turn the maximum-Vt NAND cells into the conduction state for a Read latency spec typically set to be 20 μs. Additionally, the reason to couple the identical Vpass(read) voltage to the top and bottom String-select transistors' gates is to further reduce their turn-on resistance so that a faster BL discharge speed, thus faster Read speed can be achieved.

Although the Vpass(read) of 6.0V in NAND Read operation is lower than the Vpass(program) of 10V, these 31 non-selected NAND cells would suffer a soft programming because the 6.0V gate will be coupled to floating-gate layer. The positive floating-gate voltage will attract the electrons in NAND's channel to inject across NAND thin tunnel oxide layer.

As a result in the repeated NAND Reading, more and more electrons would be gradually injected into all 32 NAND cells' floating-gate in the selected NAND String. Thus, the Vts of 32 NAND cells after each NAND read would be increased unintentionally.

The most severe soft-writing due to Vpass(read) would happen to those NAND cells with the lowest Vt states such as the E-state with Vt≤−0.7V and the A-state=0.7V.

When scaling below 3× nm, the BL proximity effect will result in a severe BL coupling noise to those NAND read operation with a BL-precharge followed a BL-discharge scheme. Since after BL-precharge period, the BL pull-up device is being shut off. In subsequent Read after precharge cycle, the discharged BLs will couple to those adjacent non-discharged BLs to ground, thus it will result in the fault reading. In order to effectively prevent this adjacent BL coupling noise, the conventional NAND's each physical page is divided into two sub-pages such as odd and even sub-pages. During the odd page read, one option of the BLs' voltage of even page are precharged to a $V_{BL}$ voltage for avoiding the Vpass(read) WL-induced disturbance due to the WL-coupling self-boosting effect in the NAND cell channels of the even page but at the expense of consuming one ½-page BL precharge current. The second option of the BLs' voltage of even page are reset to Vss for avoiding consumption of BL precharge current on even page but at the expense of suffering one ½-page Vpass(read) WL-induced disturbance.

For each Read operation, a predetermined the $V_{RD}$ is applied to the selected WL and the a WL-pass voltage, Vpass, ranging from 5-7V is applied to the unselected N−1 WLs to turn the N−1 NAND cells into the conduction state so that the On or Off state of the selected NAND cell can be accurately distinguished. The single $V_{RD}$ value of 0V is for SLC reading, but three distinct $V_{RD}$ values of 0V, 1.5V and 3V are for MLC reading and seven distinct $V_{RD}$ values are for TLC reading and 15 distinct $V_{RD}$ values are for XLC read.

Lastly, one of the drawbacks of the prior-art NAND, the SLC page-read latency averagely is about 20 μs which is too slow as compared to today's fast random NOR read latency of 100 ns for a Gb-density. Since each Read operation is from a NAND String, all the non-selected cells in the non-selected WLs or pages suffer one time of Vpass WL disturbance. MLC will suffer 3 times longer delay of about 60 μs, TLC will suffer 7 times longer delay of about 140 μs and XLC will suffer 15 times longer delay of about 300 μs. As a result, the Vpass WL disturbance becomes more severe issue in NAND memory with higher storage compression. In addition, each Read of NAND programmed states of A, B and C would consume one high BLn precharge current.

In summary, BL pre-charge operation consumes too much power in prior-art NAND Read operation, regardless of SLC, MLC, TLC and XLC, regardless of ALL BL Read or odd and even BL Read schemes.

Furthermore, in today's NAND flash market demand, more MLC, TLC and XLC storages than SLC are strongly required to further reduce the die cost by ½, ⅓, or even ¼. A larger P/E endurance cycles or a longer lifespan for a less Read disturbance and less Read latency for a superior performance are also very important.

Thus an urgent need to reduce the Read disturbances, power-consumption as well as Read latency in the conventional NAND strings and array is strongly required.

3. BRIEF SUMMARY OF THE INVENTION

This invention relates generally to architecture for improving NAND Read operation. More specifically, various embodiments of the present invention provide a NAND Read scheme for drastic reduction over the high wordline(WL)-disturbance, high bitline(BL)-precharge power consumption, and high latency issues in an extremely high-density NAND (HiNAND) memory array, regardless of data storage types such as SLC, MLC, TLC, XLC or Analog storages, regardless of 2-poly floating-gate NAND cell or 1-poly charge-trapping MONOS or SONOS cell, regardless of NMOS cell or PMOS cell.

In a preferred embodiment, the present invention provides a HiNAND memory array that comprises J (memory) Groups. Each Group comprises K Blocks and each Block further comprises a plurality of NAND Strings cascaded in X-direction. J and K are integer numbers>1. Each String comprises N NAND cells with two String-select transistors. The N can be 16, 32, 64, 128 or any integer number. Each Group of this HiNAND array comprises one Group-select transistor with a drain node connected to each global-Bit-line GBL but a source node connected to each corresponding local-Bit-line LBL plus one Group SL-select transistor with corresponding drain node connected to each j-th LBL but corresponding source node connected to a separate j-th sourceline (SL) driven by a SL driver.

The HiNAND String is preferably made of same Strings as a conventional NAND without any circuit and process changes. The HiNAND Program and Erase schemes using FN-tunneling is also kept the same as prior-art NAND without changes. Thus the detailed program and erase bias conditions are kept the same and thus skipped here to simply the description. The present invention here would focus on the HiNAND Read operation, although the Program-Verification or Erase-Verification operations are also covered. The Read operation here includes both SLC and MLC Read operations. Although TLC or XTC Read and Program conditions are little different from SLC and MLC, the disclosed technique for Faster Read, less BL precharge current and Vpass-WL disturbance are the same. Thus the above disclosed techniques can be similarly applied to TLC and XLC or even Analog Read and Program operations.

In an embodiment, this invention provides a HiNAND array including J number of Groups. Between Groups, a top metal2 layer of each global-Bit-line, GBLn, is laid out vertically per column to connect all Groups placed across Y-direction. Within one Group, each column comprises K number of Blocks that are then connected by another lower metal1 line (or a local-Bit-line) LBLj. Each Block comprises a plurality of NAND Strings. Each NAND String length can be 8, 16, 32, 64, 128 or any other integer number of NAND cells connected in series with one top String-select transistor and one bottom String-select transistor, both made of 7V devices as conventional NAND. The NAND cells in the preferred HiNAND String can be made of any type of flash cells such as NMOS or PMOS 2-poly floating-gate flash cell or 1-poly charge-trapping SONOS/MOSOS flash cell or 2-dimension or 3-dimension flash cell.

In another embodiment, this invention provides a design guideline to make the layout length ratio, R, of each local-Bit-line LBLj to each corresponding global-Bit-line GBLn no greater than 1/J for a reliable DRAM-like Latch sense amplifier (SA) to allow charge-sharing sensing scheme being applied to HiNAND Read operation. The reason for choosing this layout length ratio is to keep the capacitance ratio of each LBLj to each corresponding GBLn to be a desired value no greater than 1/(J+1).

In yet another embodiment, the present invention provides a Read method for the preferred HiNAND array. More specifically, the Read operation includes following steps for achieving a low precharge current and low Read disturbance with low latency. In an example, For J=10, the steps include a) Resting SA and predischarge LBL and GBL; b) Precharging LBLcap to a value of 1.8V Vdd; c) Charge-sharing between LBLcap and 10× GBLcap so that the highest voltage of each GBL voltage=1/11 of each LBL precharged voltage; d) Multiplying GBL by N, N is preferred to be an integer larger than 2; e) Latching the multiplied sensed voltage from NAND cell to one input of LA and Latching another VREF to second input of LA ready to be developed and amplified with a design spec of ΔV>0.2V, which is developed in Vdd and Vss of a pure digital signal; f) Transferring each stored data of final detected NAND cell to each bit of Page Buffer to complete the Read operation.

In still another embodiment, this invention discloses a method for pre-charging each jth local-bit-line LBLj (j=1 through J) with J-times smaller capacitance under 1.8V Vdd from each Group CLS line that is charged with Vdd but disconnected to GBL to prevent precharge leakage to each GBL.

In yet still another embodiment, this invention discloses a method for discharging LBLj's stored charges faster than conventional method during a precharge cycle through the selected NAND string due to a reduced capacitance value of LBLcap only 1/(J+1) as compared to the large capacitance value of GBLcap.

In an alternative embodiment, this invention discloses a method for performing multiple Read operation to increase each small GBLn's sensed voltage of 0.2V by 2×, 3× or larger with a well-designed timing control to respectively charge all capacitors that are connected in series.

In another alternative embodiment, this invention discloses a method for performing a low-current full physical page of SLC and MLC Read operation or Program-Verify operation, and Erase-Verify operation of a HiNAND array provided by the present invention. It is called an All-BL Read or Verification operation.

In yet another alternative embodiment, this invention discloses a method for performing a low-current SLC and MLC Program operation and Program-Inhibit and Erase-Verify of HiNAND array of the present invention. The Program operation can be performed in All-BL or ½-BL like odd BLe group and even BLe group.

In a specific embodiment, the present invention provides a device with a high-density NAND (HiNAND) memory architecture for lowering disturbance, power-consumption, and latency in Read and Program-Verify operations. The device includes a HiNAND array comprising a matrix of NAND memory cells divided by J number of Groups arranged along with a plurality of global bitlines (GBLs), where J is an integer number. Each Group includes a plurality of top Group-BL-select transistors controlled by a first common gate signal for respectively connecting the plurality of GBLs to a plurality of local bitlines (LBLs) and a plurality of bottom Group-BL-select transistors controlled by a second common gate signal for respectively connecting the plurality of LBLs to a common source line. Along the plurality of LBLs each Group is divided into K number of blocks where K is an even integer number. Each block includes a plurality of strings of N memory cells connected in series having N rows where N is an integer number. Each string is associated with one LBL via a string-BL-select transistor and associated with a local common source line via a string-SL-select transistor. Each row of memory cells across all strings in a block is commonly gated by a word line (WL) signal. All strings in each neighboring pair of the K number of blocks share the same local common source line connected to the common source line via a block-SL-select transistor controlled by one of K/2 third common gate signals associated with each Group. The device further includes a first plurality of data handling/control circuits respectively coupled to odd-numbered half of the plurality of GBLs of the HiNAND array. Each of the first plurality of data handling/control circuits includes a multiplier circuit, a connector circuit, a sense amplifier circuit, and a page buffer circuit to connect to one odd-numbered GBL from the HiNAND array. The device additionally includes a second plurality of data handling/control circuits respectively coupled to even-numbered half of the plurality of GBLs of the HiNAND array. The second plurality of data handling/control circuits is substantially redundant to the first plurality of data handling/control circuits. In an embodiment, the J number is at least 2 to make a ratio of a length of a LBL in one Group at least smaller than a length of a GBL through all J number of Groups for keeping a LBL capacitance smaller than a conventional GBL capacitance to provide a reduced precharge voltage outputted to the GBL by charge-sharing the GBL with the LBL in the Group for achieving multi-fold reduction in discharging time for faster Read and Program-Verify operations. In an embodiment, the multiplier circuit in each of the first and the second plurality of data handling/controlling circuits is configured to multiply the reduced precharge voltage by multi-fold before being coupled by the connector circuit to the corresponding sense amplifier circuit for properly sensing and transferring a digital signal associated with threshold states in a selected memory cell in the HiNAND array to one or more digital bits in the page buffer circuit with substantial reduction in power consumption, word-line Read and Verify disturbance, and operation latency.

In an alternative specific embodiment, the present invention provides a method for performing NAND Read operation and Program-Verify operation upon a selected memory cell configured in a high-density NAND (HiNAND) architecture. The method includes configuring a HiNAND memory array having a plurality of columns respectively associated with a plurality of global bit lines (GBLs) to divide each column of memory cells into J number of Groups. Each Group is associated a local bit line (LBL) where J is an integer number greater than 1. The method further includes configuring a high-voltage NMOS transistor controlled by a bias signal to connect each of the plurality of GBLs to a multiplier and a page buffer, configuring the multiplier with a M-stage multiplication circuit for multiplying a voltage value by number M where M is an integer greater than 1, and configuring a connector to couple an output voltage from the multiplier to latch a sensing voltage to a latch sense amplifier coupled between the connector and the page buffer. Additionally, the method includes resetting the page buffer and the latch sense amplifier to predischarge a GBL and a LBL associated with the GBL. The LBL corresponds to a selected Group from the J number of Groups in the HiNAND memory array. The method further includes precharging the LBL to Vdd for a selected string in the selected Group with a selected memory cell while keeping the GBL to Vss. Furthermore, the method includes sharing Vdd charge of the LBL with the GBL to couple an bitline voltage at the GBL with a high value reduced to about 1/(J+1) of Vdd or lower for an Off-state of the selected memory cell or a low value substantially equal to zero for an On-state of the selected memory cell. The method further includes multiplying the bitline voltage by number M through the multiplier to provide an output voltage. Moreover, the method includes coupling a sensing voltage associated with the output voltage through the connector to the latch sense amplifier followed by coupling a reference voltage to the latch sense amplifier, the sensing voltage and the reference voltage having a voltage difference and developing the voltage difference by the latch sense amplifier to a digital signal. The method includes configuring the page buffer to transfer the digital signal into a digital bit in the page buffer corresponding to multiple threshold states of the selected memory cell.

The present invention provides a preferred memory array architecture named as HiNAND array being divided into a plurality of Groups with a top Group-BL-select transistor and a bottom Group-BL-select transistor. Each Group preferably comprises a plurality of NAND Blocks. Each NAND Block comprises a plurality of NAND Strings cascaded in X-direction. Each NAND String can be made same transistors as the conventional NAND String with same layout pitch, same Program and Erase FN-channel tunneling scheme and same SL architecture.

Many benefits can be achieved with the application of embodiments of the present invention. Unlike the conventional NAND array using a latch-type sensing circuit, the HiNAND array employs a novel DRAM-like sensing circuit with a preferred hierarchical-BL charge-sharing scheme and boosting sensing signals. The whole BLs of this HiNAND array are preferably being accessed simultaneously without a need of being divided into two (odd and even) sub-pages for reliable Read or Program-Verify operation. Another advantage of this all BLs Read scheme of the present invention lies in that it consumes zero DC current in each BL. This is a great saving in power consumption over the conventional All-BL Reading schemes.

Additionally, although a DRAM-like charge-sharing Read and Program-Verify operations is provided in this HiNAND array, there is no need of any periodic refreshing of the HiNAND stored data, regardless of SLC, MLC, TLC and XLC, because the HiNAND cell is also a non-volatile NAND memory. After power is removed, the data is still retained.

During this novel DRAM-like Read operation, the precharged LBLj voltage is discharged to ground if the selected NAND cell's Vt is lower than $V_{RD}$ voltage. On the contrary, the pre-charged LBLj voltage is not discharged to ground and thus remains at pre-charged level of $V_{BL}$ around 1.8V of Vdd. During the Read operation, the charges of 1.8V or 0V in the LBLj will be dumped into the corresponding GBLn for subsequent DRAM-like sensing Read. Since HiNAND array only needs to charge smaller local-Bit-line LBLj capacitance which is about 1/(J+1) of each global-Bit-line GBLn capacitance of a conventional NAND, thus both Read disturbance and Read power consumption can be reduced substantially. As a result, a longer NAND life span with a higher P/E endurance cycles can be achieved.

4. BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

5. DETAILED DESCRIPTION OF THE INVENTION

Figure 1:
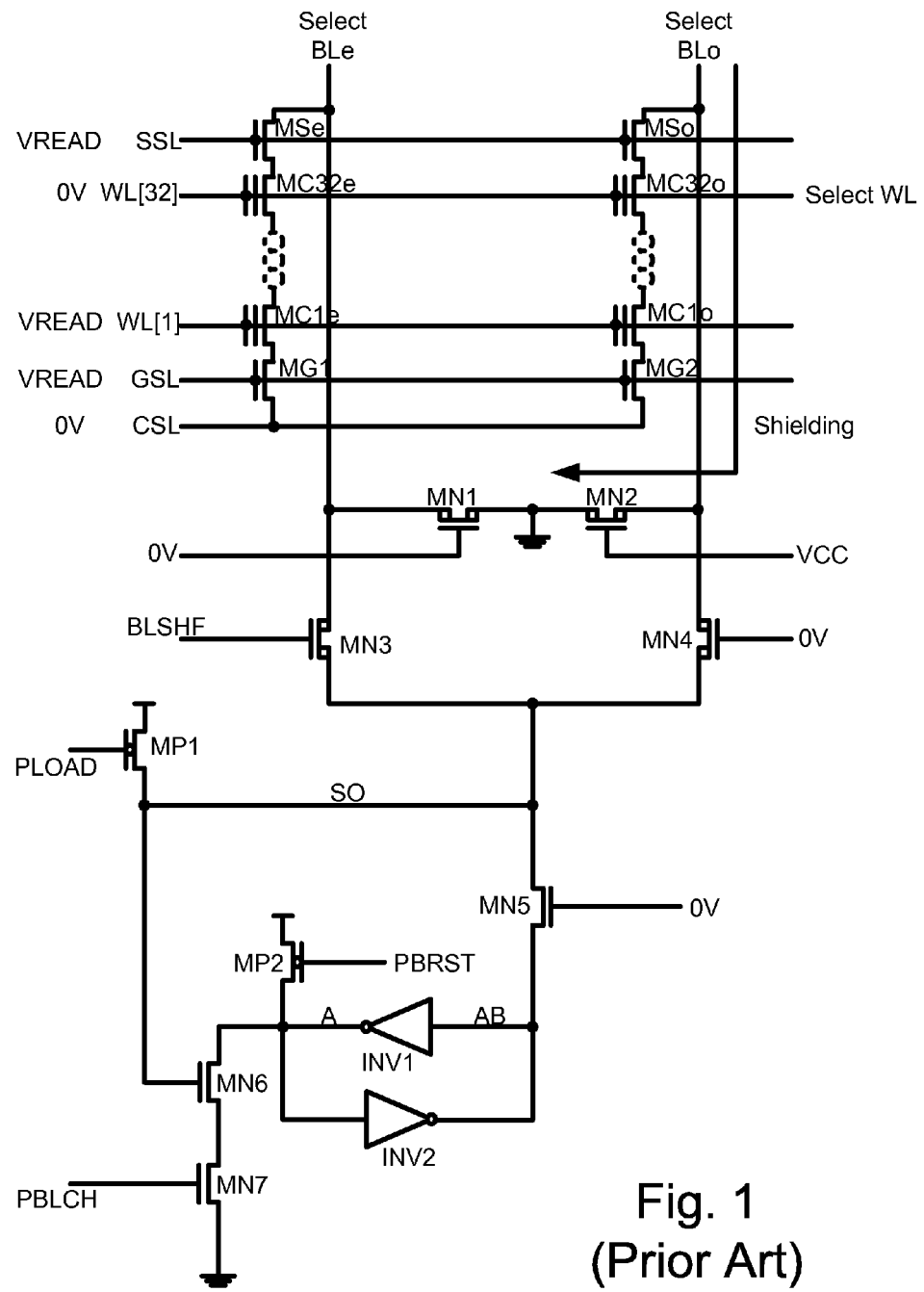
FIG. 1 shows a typical conventional NAND Sense Amplifier with one latch for a SLC Read operation.

In the following detailed description of the present invention, reference is made towards the accompanying drawings, flows and tables that form a part hereof and in which is shown, by way of illustration, specific embodiments in which the invention may be practiced. In the drawings, like numbers describe substantially similar components throughout the several views and embodiments. These embodiments are described in sufficient detail with a goal to enable those skilled in the art to practice the invention. Other embodiments may be made without departing from the scope of the present invention. The following detailed description is not to be taken in a limiting sense. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels X-direction, Y-direction, left, right, front, back, top, bottom, forward, reverse, clockwise and counter clockwise have been used for convenience purposes only and are not intended to imply any particular fixed direction. Instead, they are used to reflect relative locations and/or directions between various portions of an object or circuit layout.

In general, a novel HiNAND array architecture is to be disclosed in the following sections of the present invention, which comprises a plurality of novel NAND Groups that are not found in conventional NAND array. In particular, each of the plurality of novel NAND Groups comprises a plurality of NAND Blocks arranged in Y-direction and each Block comprises a plurality of Strings arranged in layout in X-direction.

Besides the conventional row (WL) decoders and column BL decoders, a new Group decoder and a SL decoder are added in this new HiNAND array architecture. Each Group BL-select transistor is like a divided BL transistor connected between each GBL and LBL and each Group SL-select transistor is added between LBL and GSL. Note, GBL is referred as Global BL, while LBL is called Local BL and GSL is a Global SL driven by the GSL decoder. Each GBL has a plurality of LBLs in the HiNAND array.

Besides BL architecture difference between the HiNAND array and conventional NAND array, the sense amplifier (SA) and its associated Read steps of the HiNAND array are also made different from the conventional NAND array with the purpose to drastically reduce the Read current, particularly, the BL-precharge current and Read latency as well as Read-induced WL disturbance.

The preferred HiNAND array to be shown below adopts a new DRAM-like Latch SA (sense amplifier) with different sensing steps in each Read operation. One of the advantages of this new sensing circuit is to allow ALL-BL Read so that the WL-disturbance is reduced by 50% and the NAND Read data has least error.

Basically, for either NAND or HiNAND design, the major peripheral circuits include the page buffer, WL-decoders, BL-decoders, SL-decoders and Group decoders, sense amplifier (SA), the high-voltage (HV) pump circuits for respective Read, Program and Erase operations and the on-chip state-machine that automatically controls the defined timings, waveforms, voltages and sequences of key operations such as Erase, Erase-Verify, Program, Program-Verify and Read operations.

For illustrating the improvement of the preferred HiNAND array architecture over the conventional NAND array, some description about detailed operation of a conventional NAND array shown in FIG. 1 will be firstly explained below. FIG. 1 is a typical conventional NAND Sense Amplifier with one Latch for a SLC Read operation of a conventional NAND array. Only two BLs of the NAND array are shown to be divided into one paired lines of BLo in right and BLe in left. The BLo stands for Odd BL, while BLe stands for Even BL.

The whole NAND array is divided into two BL groups with equal number of BLs such as ½ Odd BLs and ½ Even BLs.

In each BLo or BLe, it directly connects to a plurality of NAND Strings. Each NAND String comprises 32 (as an example) 2-poly NMOS NAND cells connected in series and are sandwiched by one top 1-poly NMOS String BL-select transistor MSe in BLe or MSo in BLo, with their gates tied to a common signal of SSL and one bottom SL-select transistor such as, MG1 and MG2, with their gates tied to another common signal denoted as GSL and the String's source nodes are connected to a common SL, denoted as CSL. Note, all transistors of MS1, MS2, MG1 and MG2 transistors are MHV NMOS 1-poly devices that must sustain the String Program-Inhibit voltage across their respective Vds of about 7V during the self-boosting coupling effect commonly used in NAND FN-tunneling page Program operation. The 32 NAND gates of each string are connected to 32 WLs such as WL[1] through WL[32].

Besides NAND array, one Latch per pair of BLe and BLo with PRESET and PLOAD and PBLCH control signals for program verify function are also shown. Since one pair of BLo and BLe shares one sensing Latch circuit, INV1 and INV2, thus only one NAND string in either BLo or BLe are selected for read operation in prior-art NAND array. Thus this conventional NAND array and sensing circuit do not offer ALL-BL Read. In other words, to read whole physical page requiring two sub-steps to read either BLe group first and then BLo group later or vise versa.

In the conventional NAND array, only two strings are shown with one pair of BLo and BLe. In fact, the full NAND array, there are up to 4 KB pairs of BLo and BLe lines per WL or per physical page with 8 KB in size. Similarly, there are pluralities of NAND Strings in each BLo and BLe. The number of NAND Strings is subject to the required NAND density. The number of NAND cell transistors in each NAND String can be 16, 64, 128 or any arbitrary integer number. And the NAND storage types can be SLC, MLC, TLC, XLC or Analog, depending on the applications and data reliability requirements.

Figure 2:
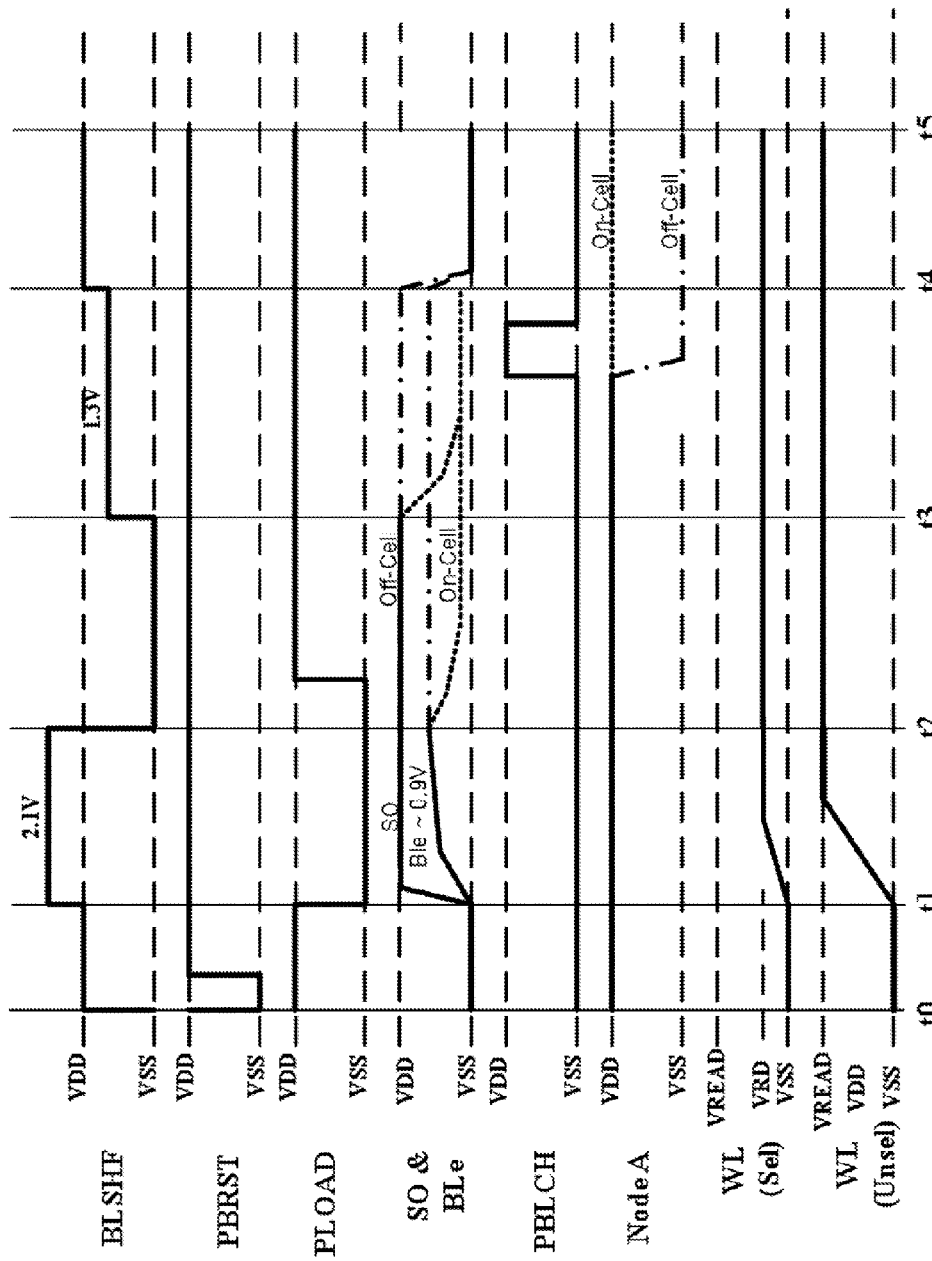
FIG. 2 shows typical time lines of key control signals for operating conventional NAND array with a conventional NAND Sense Amplifier with one latch as seen in FIG. 1 in the Read operation.

FIG. 2 shows typical time lines of key control signals for operating conventional NAND array with a conventional NAND Sense Amplifier with one latch as seen in FIG. 1 in the Read operation. The key control signals include BLSHF, PBRST, PLOAD, SO & BLe or SO & BLo, PBLCH, Node A, WL (selected one) and WLs (unselected 31 ones), etc. for operating BL precharge and discharge, charge up of one selected WL and 31 unselected WLs, and proper control sequences for NAND data sensing and latch function for SLC Read operation.

For illustrating many differences of the HiNAND array according to an embodiment of the present invention from the conventional NAND array, the 32T NAND String in FIG. 1 is used although the spirit of the present invention is not limited to a 32T String NAND array. The following explanations of key operations associated with the 32T String NAND array are referenced to both FIG. 1 and FIG. 2. The key operations include Program, Program-Verify, Erase-Verify, and Read operations. Particularly, the Read operation would be described in more details. In other words, for a regular NAND Read operation, the selected NAND cells in a selected page are assumed being programmed already with different Vtn states before the Read operation. This Vtn are defined differently in different storage types such as SLC, MLC, TLC, XLC or Analog storages. How to program the specific Vtn into the NAND cells is not the topic to be covered here. All those conventional Program and Erase schemes and methods can still be used here for the present invention. But instead, because a Program-Verify operation and Erase-Verify operation are substantially a Read operation, thus they can be replaced by the Read circuits and techniques disclosed by the present invention as for the purpose of current, disturbance and latency reduction.

In FIG. 1, each NAND BL includes one 20V high voltage (HV) NMOS transistor as a HV buffer to protect each corresponding LV latch-type SA (sense amplifier) from being damaged during the 20V Erase operation. These HV NMOS transistors are MN3 and MN1 for BLe and MN2 and MN4 for BLo. Since these 20V HV buffer devices have to sustain more than 20V Vds punch-through and to fit in a very tight pitch of each BL in the NAND array such as 19 nm width associated with a 20 nm NAND node but the channel length of these transistors are made more than 0.5 µm. As a result, these HV NMOS transistors have a device ratio of width/channel=25, thus has a very high resistance and large silicon area and is not good for performing BL precharge during the first cycle of NAND Read operation.

As shown in FIG. 1, the BL precharge current path is flowing from a PMOS transistor, MP2, through a common node of SO and splitting into two paths. The first precharge current path is through a NMOS transistor MN3 to precharge BLe with a BLSHF control signal coupled to a voltage higher than the MN3's Vt and the gates of other NMOS transistors MN1 and MN4 being grounded in a shut-off state. Conversely, the second precharge current path is through the NMOS transistor MN4 with its gate coupled to similar BLSHF control signal on the MN3 into a conduction state to precharge BLo's big capacitance with the MN3 held in shut-off state by grounding BLSHF control signal.

Although, the gate voltage of both MN3 and MN4 can be increased to a higher voltage during each BL precharge cycle to reduce the conduction resistance, the full passage of Vdd from node SO supplied by a PMOS device, MP1, results in many disadvantages. For example, all Odd and Even BLs, BLo and BLe, in the conventional NAND array would be pre-charged to a highest value of Vdd for the initial $V_{BL}$. That leads to the highest BL precharge current and the slowest discharge speed, thus the slowest read latency and largest Read-induced WL-disturbance due to the longest discharge time. All these disadvantages are against today's low-power and low-disturbance green NAND design practice. And that is why the initial precharged $V_{BL}$ of BLe and BLo has been reduced below Vdd to a value of about 0.9V for a reliable sensing margin as well as precharge current reduction.

In order to limit BLo and BLe precharge voltage at about 0.9V during the precharge cycles in Read, Program-Verify and Erase-Verify operations, as shown in FIG. 2, the gate signal, PLOAD, of MP1 is grounded to fully turn on the PMOS MP1 device. The node of SO would be precharged to Vdd value to fully turn on the gate of NMOS device, MN6, along with MN5 and MN7 NMOS devices all in a shut-off state because the gates of MN5 and MN7 are grounded (see FIG. 1).

In order to limit the $V_{BL}$=0.9V at BLo and BLe lines with SO node at Vdd, the gate voltage of 20V NMOS transistors MN3 and MN4 has to be clamped at a voltage, $V_{BLSHF}$=0.9V+Vt, where Vt is the threshold voltage of either MN3 or MN4. Conventionally, $V_{BLSHF}$ is set to a value of 2.1V. That proves that the Vt value is tuned to be 1.2V for both MN3 and MN4, the 20V HV NMOS enhancement devices.

In order to ensure the precharge current flow from MP1 to BLe without leakage, another 20V HV NMOS transistor, MN4, along the current path has to be kept in shut-off high-impedance state with its gate tied to ground, as seen in FIG. 1. As shown, BLe is the selected BL in ½-BL Read in the conventional NAND array. Conversely, for the non-select BL, BLo, it is pulled to ground through the transistor MN2 with its gate coupled to Vdd voltage. For Vdd is at 1.8V, transistor MN2 gate of 1.8V is still higher than its Vt of 1.2V, thus BLo=0V. That means during the ½-BL Read scheme, the half of non-selected BLs would not endure the high BL precharge current but at expense of high WL-disturbance.

On the contrary, if BLo becomes the selected BL, then BLo=0.9V but BLe=0V because it becomes the un-selected BL. In some other implementations, the node between 0V HV transistors MN1 and MN2 are tied to Vdd. That means the $V_{BL}$ of non-selected BLs are set to be Vdd, instead of Vss, for avoiding WL-disturbance by self-boosting effect as Program operation but at expense of adding precharge high current in half of BLs.

In conclusion, the conventional NAND Read operation has following drawbacks: a) It is not an ALL-BL 1-cycle Read scheme. Thus the read latency is 2-fold (2×) slower because reading one whole physical page needs two cycles. The first cycle is to read the ½-Odd page and the second cycle is to read another ½-Even page or vise versa. b) It consumes 1.5-fold (1.5×), BL precharge current due to the 2-cycle Read. When reading first half-page BLe lines, the Read operation still needs to precharge the whole BLe lines and the whole BLo lines to avoid read-induced WL stress happening on the NAND flash cells in selected page in BLo lines. After reading NAND cells in all BLe lines, all BLe lines may be discharged to Vss if all cells stores the same Vt. Then, when the second cycle moves to read all BLo lines, all BLe lines still need to be pre-charged again but not BLo lines because they are still in precharged states done in the first cycle. As a result, total BLo and BLe lines are precharged 1.5×. c) 2-cycle Read suffers 2-fold Read-induced Vpass (6V) WL disturbance. It is because each half-page Read, all 32 WLs have to be coupled with Vpass of 6V for 31 times during the whole 32T NAND String Read course. Regardless BLo or BLe Read, 2-cycle Read will suffer 2-fold stress, thus shorter lifespan.

Now, the function of Latch of the conventional NAND SA and storage circuit is illustrated in FIG. 2 in associated with the waveforms and time lines. Each Latch circuit is comprised of two LV CMOS Inverters such as INV1 and INV2. Before the precharge cycle, the Latch has to be reset to high at node A by turning on the LV PMOS device, MP2, with LV MN7 device biased in off-state by grounding PBLCH control signal so that no leakage path from node A to Vss through LV NMOS devices MN6 and MN7 as seen in FIG. 1.

After the precharge-cycle, if the selected NAND cell's Vt is higher than $V_{RD}$ of verify voltage, then there is no conduction current flowing though the selected NAND cell in the selected BLe line. As shown in FIG. 1, the initial precharge voltage at the node SO still retains Vdd and BLe retains 0.9V, e.g., SO=Vdd and BLe=0.9V. Thus when PBLCH control signal switches from Vss to Vdd, the node A will be pulled down to Vss to flip the Latch state because both MN6 and MN7 are biased in a conduction state (see FIG. 1). The sum of the effective pull-down resistance of MN6 and MN7 are made smaller than the pull-up resistance of the PMOS transistor MP1.

Conversely, if the selected NAND cell's Vt is smaller than $V_{RD}$, then the NAND cell will conduct the current to pull down BLe's precharge voltage of 0.9V to ground because the MP1 is in off-state and cannot hold SO node voltage at Vdd again. As shown in FIG. 1, the MN6 will be in shut-off state because its gate node SO is at 0V. Therefore, node A still stays at Vdd and NAND cell Vt is detected to be higher than $V_{RD}$.

In case of SLC storage, $V_{RD}=V_{RD1}$. In case of MLC storage, there are three $V_{RD}$ values to be determined from three steps of three WL's voltages.

FIG. 2 shows the waveforms and time sequence for one Read operation cycle. More details of the Read operation control in terms of the conventional NAND Sense Amplifier with one latch as seen in FIG. 1 are shown below:

a) In period of t0-t1: The initial set up period. BLSHF=Vdd=1.8V, node SO connects to BLe line but disconnects to BLo line. PBRST signal is switched from Vss to Vdd, to set node A to Vdd and then shut off. PLOAD=Vdd, to shut off MP2 and set node SO at Vss. BLe=Vss(Initial voltage). PBLCH=Vss to prevent leakage through MN7 during Latch's preset period. Node A is at Vdd after Latch preset period. WL(selected)=Vss. WL(non-selected ones)=Vss.

b) In next period of t1-t2: BL precharge, WL-select set up and WL-non-select charge-up period. BLSHF=Vdd=2.1V, to precharge BLe=0.9V but BLo=VSS. PBRST remains Vdd to keep node A at Vdd. PLOAD=Vss to supply the precharge current to BLe through MN3 with MN1 at off state. SO=Vdd, BLe=0.9V (Initial voltage), BLo=0V. PBLCH=Vss to prevent leakage through MN7 during Latch's preset period. Node A remains at Vdd. WL(selected)=$V_{RD}$, switched from 0V to $V_{RD}$. WL(31 non-selected ones)=VREAD, switched from 0V to 6V.

c) In next period of t2-t3: BL discharged or remains precharged state, WL-select set up and WL-non-select charge-up period. BLSHF=Vss to shut off the MN3 for faster BLe discharge due to no precharge current flow again if cell's Vt<$V_{RD}$. If cell's Vt>$V_{RD}$, then BLe stays at the precharge value of 0.9V. PBRST remains at Vdd to keep node A at Vdd. PLOAD=Vdd to stop the precharge current to BLe through MN3 with MN1 at off state. Node SO is at Vdd and BLe=0.8V if NAND Vt>$V_{RD}$ but SO=BLe=Vss if NAND Vt<VRD. PBLCH remains at Vss to prevent leakage through MN7 during Latch's preset period. Node A remains at Vdd. WL(selected) keeps $V_{RD}$=0V for SLC. WL(non-selected ones) keeps $V_{READ}$=6V.

d) In next period of t3-t4: NAND cell Vt sensing and determination period. BLSHF=1.3V to reconnect SO to BLe preparing for Sensing NAND cell in BLe. PBRST remains at Vdd to keep node A at Vdd. PLOAD=Vdd to stop the precharge current to BLe through MN3 with MN1 at off state. SO=Vdd and BLe=0.8V if NAND Vt>$V_{RD}$ but SO=BLe=Vss if NAND Vt<VRD. PBLCH is an one-shot pulse to latch the precise data through MN7 during Latch's preset period. Node A remains at Vdd. WL(selected) keeps $V_{RD}$=0V for SLC. WL(non-selected ones) keeps $V_{READ}$=6V.

e) In next period of t4-t5: The end period of half-page Read operation. All signals are reset with a set of biased conditions like at t0-t1, preparing for BLo sensing for next read cycle.

The drawbacks of this conventional NAND Read operation have been described in the background section of this application, which serve main objective of the present invention to reduce power consumption, lower disturbance and latency, and enhance read speed and memory circuit lifetime. More specific embodiments of the present invention will be presented below.

Figure 3:
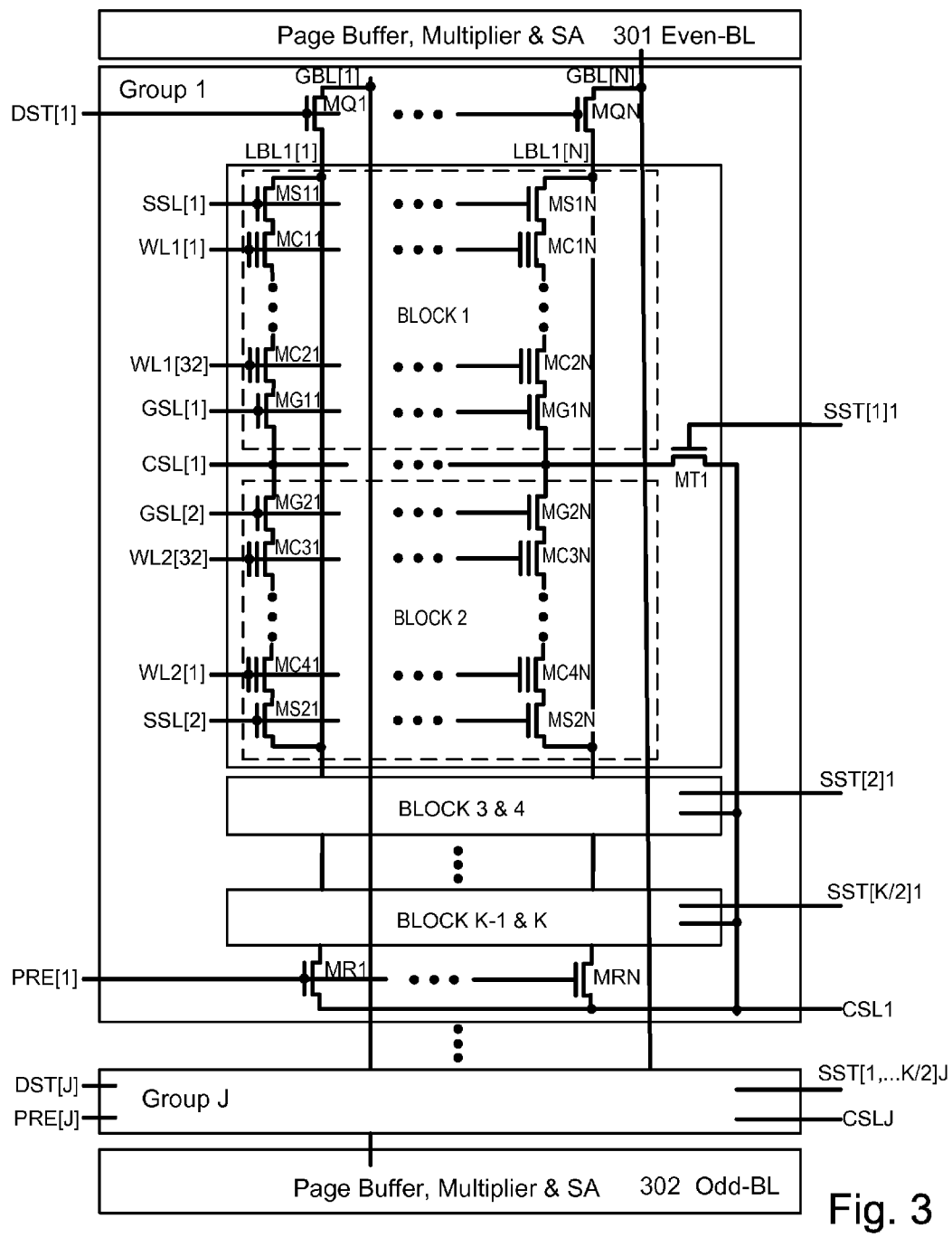
FIG. 3 is a circuit diagram of a preferred HiNAND array with a hierarchical-BL architecture coupled with Page Buffer, Multiplier, and Sense Amplifier according to an embodiment of the present invention.

FIG. 3 is a circuit diagram of a preferred HiNAND array with a hierarchical-BL architecture coupled with Page Buffer, Multiplier, and SA (sense amplifier) circuits according to an embodiment of the present invention. This diagram is merely an example, which should not unduly limit the scope of the claims. One of ordinary skill in the art would recognize many variations, alternatives, and modifications. As shown, this preferred HiNAND array is comprised of J Groups and each Group comprises K Blocks and each Block comprises N NAND Strings cascaded in X-direction, J and K are integers greater than 1. Each NAND string is a 32T Strings as an example for description convenience, although t number of HiNAND cells in each HiNAND String can be 8, 16, 32, 64, 128 or any arbitrary integer number. Currently in this specification, 32T is just used as an example for illustrating embodiments of the present invention. Thus, the total HiNAND memory bits=J×K×32N with each GBL having J×K×32 NAND transistors but each LBL having K×32 NAND cells. In an embodiment, the number J is made to be greater than 10 for achieve most benefits of the present invention as more details are shown in following sections of the specification.

In the conventional NAND array architecture (for example, see FIG. 1), each Bit line BLo or BLe is made a long BL metal line, running from NAND array top to bottom without being divided. BLo and BLe are substantially referred as a global BLo, GBLo or respectively a global BLe, GBLe. Conversely, in this preferred HiNAND array architecture, both GBLo and GBLe are being divided into J number of local BLo lines denoted as LBLo, and J number of local BLe lines, denoted as LBL, respectively. In other words, each column of this preferred HiNAND array (FIG. 3) has one GBL line associated with J number of LBL lines. Within each column, each GBL uses a metal2 line to connect J number of Groups and each LBL uses another metal1 line to connect K Blocks within each Group. In process topology perspective, the GBL metal2 line is formed on top of the LBL metal1 line of each Group, both metal lines are laid out in parallel in Y-direction and are perpendicular to all WLs laid in X-direction in a hierarchical-BL architecture.

In a specific embodiment, by increasing the number of NMOS top Group-BL-select transistors (MQ devices) from 1 to 2 per one GBL and accordingly increasing the DST signals from 1 to 2, then every two LBLs can share one GBL in a 2× related layout pitch in the hierarchical-BL architecture.

In another specific embodiment, similarly, by increasing the number of NMOS top Group-BL-select transistors (MQ devices) from 1 to 4 per GBL and accordingly increasing the DST signals from 1 to 4, then every four LBLs can share one GBL in a 4× related layout pitch in the hierarchical-BL architecture. In theory, the hierarchical-BL architecture can be extended to 8 and 16 LBLs sharing one GBL depending on layout process complexity trade-off. Practically, 1 to 2 or 1 to 4 may be the preferred choice.

As shown in FIG. 3, the whole HiNAND array has N number of GBLs such as GBL[1] through GBL[N]. Each Group of the J number of Groups has one top Group-BL-select transistor per one GBL connecting a corresponding LBL[1] through LBL[N]. For example, a first top Group-BL-select transistor MQ1 with top drain-end connected to GBL[1] and the source-end connected to a LBL1[1], and so on, and a last top Group-BL-select transistor MQN with top drain-end connected to GBL[N] and the source-end connected to a LBL1[N]. All top Group-BL-select transistors for each String (associated with one LBL of number 1, 2, through, N) in the first Group (j=1) are controlled with a common gate signal DST[1]. For all LBLs in Group 1, one bottom Group-BL-select transistor (corresponding to each of the N number of GBLs) such as MR1 through MRN is controlled by another common gate signal PRE[1] to connect the LBL[1] through LBL[N] respectively to a common source line CSL1 along X-direction. For all other Groups through J, this structure repeats the same with one corresponding common source line CSLJ per Group. In the hierarchical-BL architecture, each LBL[N] is laid as a metal1 line connected upward to the GBL[N] laid as a metal2 line topologically above and in parallel with each other. The CSLJ is laid as another metal0 line topologically below the metal1 line and perpendicular to both the metal1 lines and metal2 lines. Each LBL[N] for any Group j also is connected downward with the common source line CSLj via a bottom Group-BL-select transistor MRN. All MQ1 through MQN and all MR1 through MRN devices are high-voltage 1-poly NMOS device, for example, NMOS device with a BVDS (Breakdown Vds voltage same as all MS or MG) of about 7V.

In a specific embodiment, for a selected Group j, a precharge voltage for bitlines from Vss to about 7V can be applied from bottom through the common source line CSLj via the bottom Group-BL-select transistors as low-resistance paths/sources to independently or concurrently precharge or discharge one or more of the plurality of LBLs. When the common source line CSLj is 0V, all of the plurality of LBLs are discharged with the common gate signal PRE[j] being set to Vdd. When the common source line CSLj is a desired precharge level up to a breakdown voltage of the bottom Group-BL-select transistor (MR1 through MRN), one or more of the plurality of LBLs are charged to this desired precharge level by setting the common gate signal PRE[j] to a voltage level of Vdd plus a margin at least greater than a threshold voltage of the bottom Group-BL-select transistor.

In an alternative specific embodiment, for a selected Group j, a precharge voltage for bitlines from Vss to about 7V can be also applied from top through the plurality of GBLs via the top Group-BL-select transistors as low-resistance paths/sources to independently and concurrently precharge or discharge one or more of the plurality of LBLs. While in conventional NAND array, the precharge operation was performed through a high-resistance mega-ohm NAND string path. In this invention, it is preferred to use a metal0 line of the CSLj to precharge and discharge the metal1 lines of the LBL lines due to less power consumption and lower latency in Read and Verify operations, as explained below in this specification.

Each GBL[N] has a longer metal2 line from the top to the bottom of the whole NAND array with a high metal2 capacitance, while each LBL[N] has a shorter metal1 line in layout with a smaller metal1 capacitance. In real HiNAND array layout, the metal2 GBL[N] line is topologically laid out on top of and in parallel to the metal1 LBL[N] lines to form a hierarchical-BL architecture. Since metal2 line is on top of metal1 line, thus metal2 capacitance per micron length is almost one half of metal1 capacitance per micron length due to that metal2 line height in topology is almost twice of the oxide thickness of the metal1 line measured from P-substrate.

Each of the J number of Groups further comprises K number of Blocks. Each Block is further formed with a matrix of 32 NAND cell pages such as WL[1] through WL[32] with one top String-BL-select transistor, MS11, gated with a signal of SSL[1] and one bottom String-SL-select transistor, MG11, gated with another signal of GSL[1] in Block1 corresponding to the local bitline LBL1. There are total N number of global BLs such as GBL[ ] through GBL[N] and N number of total LBLs such as LBL[1] through LBL[N] per Block, but total K number of Blocks per one Group. All MS11 through MS1N and all MG11 through MG1N devices are high-voltage 1-poly NMOS device, for example, NMOS device with a BVDS (Breakdown Vds voltage same as all MS or MG) of about 7V. Each of J number of Groups contains K number of Blocks such as Block[1] through Block[K]. Each Block comprises N number of 32T NAND Strings arranged in X-direction. For each Group, e.g., Group 1, two 32T NAND Strings in two adjacent Blocks mirrored in Y-direction share one local common source line (e.g., CSL[1] for Block 1 and Block 2)

connected also via a metal0 line to one NMOS LV device (e.g., MT1) controlled with a common gate signal (e.g., SST[1]1 for Block 1 and Block 2). Each local common source line is shared by two neighboring blocks. For example, CSL[1] is shared by Block 1 and Block 2, as shown in FIG. 3, and connected to two source nodes of the two corresponding strings in Block 1 and Block 2 respectively through two String-SL-select transistors MG11 and MG21. This structure is repeated for all K/2 paired Blocks. Each local common source line in Group 1 is coupled to the common source line CSL1 via the NMOS LV transistor MT1 with its gate tied to a control signal SST[1]1. Accordingly for K number of Blocks in one Group, there are K/2 number of such transistors MTK/2 each associated with a control gate signal SST[K/2]1. K is an even number. These structures are further repeated in all Groups from Group 1 through Group J.

Further as shown in FIG. 3, each NAND String (e.g., the first String) within one Block (e.g., Block 1) comprises 32 NAND cells connected in series with one top String-BL-select transistor, MS11, gated with SSL[1] in Block 1, and one bottom String-SL-select transistor, MG11, gated with GSL[1] in Block1. The 32 HiNAND cells, MC1 through MC32, are still made of the same way as the conventional NAND array in terms of cell pitch, layout, and process. The HiNAND cells within the same HiNAND plane, Group, Block and String are formed on the same p-well within the same common deep N-well on top of same P-substrate. The number of HiNAND cells in each HiNAND String can be 8, 16, 32, 64, 128 or any arbitrary integer number, determined by the tradeoff between String size and String performances such as NAND data reliability and Read latency. Similarly as the conventional NAND, each HiNAND cell that stores one bit data is also referred as a SLC cell, two-bit data referred as a MLC cell, three-bit data referred as a TLC cell and 4-bit data is referred as a XLC cell, etc. A SLC cell is designed to store two distinct Vt states, a MLC cell stores four distinct Vt states, a TLC cell stores 8 distinct Vt states, a XLC cell stores up to 16 distinct states and an Analog cell stores more than 16 distinct states such as up to 256 states.

As shown in FIG. 3, each row of the HiNAND cells that corresponds to one word line, WL, within a Block is defined as one physical page or multiple logical pages of storages. As the conventional NAND, the size of each HiNAND physical page can be 8K bytes (8 KB) or higher 16 KB, depending on the application. And each HiNAND cell page can be further divided into two sub-pages such as ½ Odd-number sub-page and ½ Even-number sub-page with interleaving Odd and Even bit lines. Accordingly, FIG. 3 shows two separately laid out groups of Page Buffer, Multiplier, and Sense Amplifier circuits. Circuits 301 are configured to couple with GBLs of all Even-numbered sub-pages of the whole HiNAND array and circuits 302 are configured to couple with GBLs of all Odd-numbered sub-pages of the whole HiNAND array. In addition to the regular 2 KB-8 KB NAND cells, there are some extra spare NAND bytes are also connected to each full page or sub-page for storing ECC syndrome bytes. The size of syndrome bytes is determined by the number of error bits that are generated during NAND product life endurance cycles.

In a specific embodiment, the HiNAND memory array architecture is associated with one single circuit of Multiplier, Latch sensing amplifier (SA), and Latches per one SLC or MLC or TLC or XLC or Analog storage. Unlike conventional NAND array architecture where each sensing circuit's input is directly connected to a long GBL metal with a high GBL capacitance, GBLcap, denoted as GBLcap, each long GBL metal in layout of this preferred HiNAND array is divided into J number of Groups and each Group has a much smaller capacitance denoted as LBLcap. As a result, each NAND column has one associated GBL with a large GBLcap and J LBLs with a smaller capacitance of LBLcap. A preferred capacitance ratio of LBLcap/GBLcap is no greater than 1/(J+1) for optimized reliable sensing and precharge current reduction. For all N number of GBL, each Group has one top Group BL-select transistor, MS1N, gated by a common signal of SSL[1] and one Group SL-select transistor, MS2N, gated by another common signal of SSL[2]. All GBLs are then connected to a Multiplier, Connector, Latch sensing amplifier (SA) and Latch bits of Page Buffer, preferably located at either top or bottom of the HiNAND flash array as seen in FIG. 3, resulting a DRAM-like Latch-SA circuit. With this novel DRAM-like Latch-SA circuit, the HiNAND array of the present invention can be read like ALL-BL without a division of BLo and BLe for performing Read operation two times with zero DC current in each Latch-SA. As a result, the high BL precharge current, high read-induced WL disturbance and high read latency effect can be drastically reduced. The detail descriptions of the All-BL Read operation associated with this HiNAND array will be shown below in association of description of the Latch-SA circuit.

Figure 4:
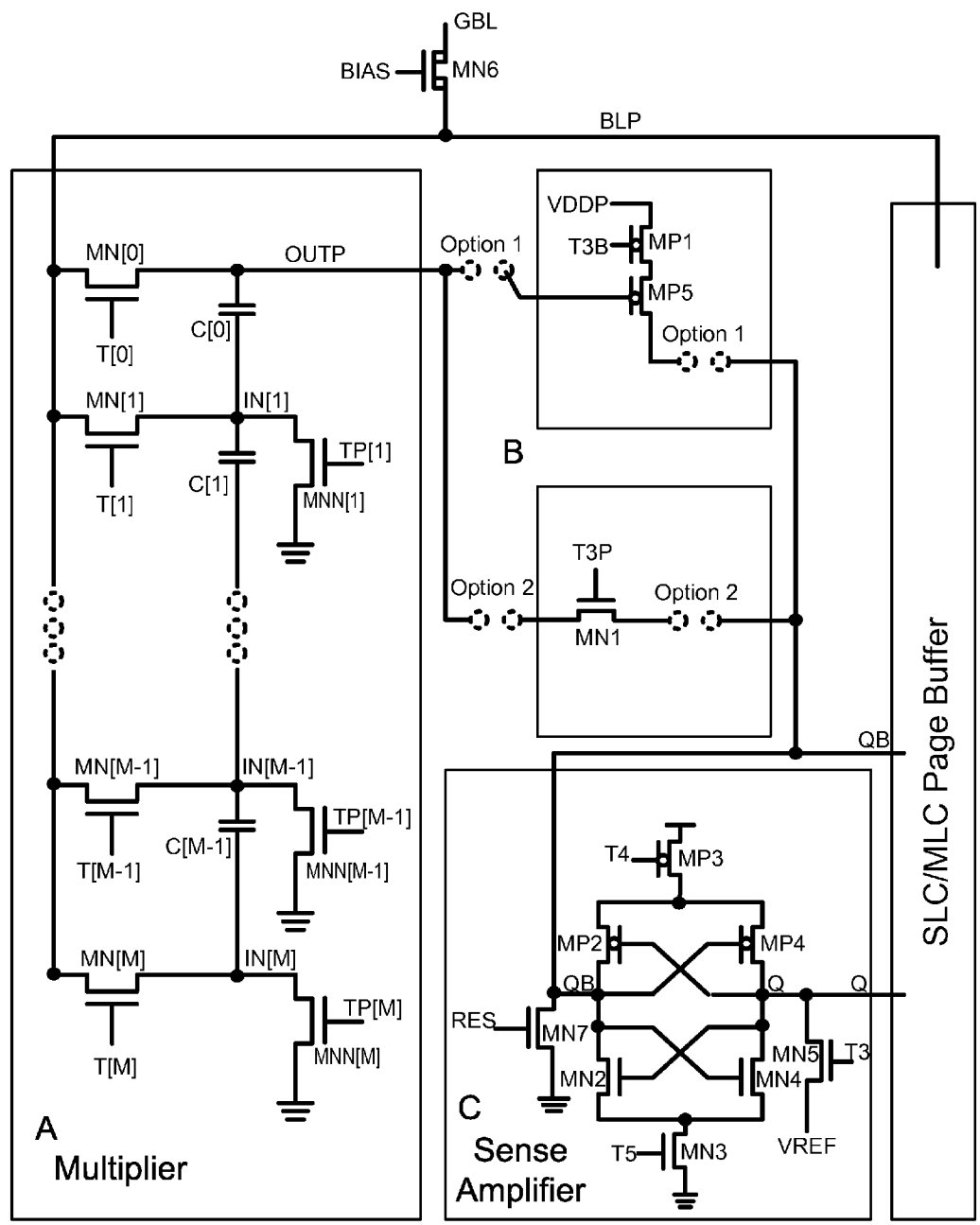
FIG. 4 is a circuit diagram combining one Multiplier circuit, one Latch-SA circuit, and one of two optional Connector circuits per GBL according to an embodiment of the present invention.

FIG. 4 is a circuit diagram combining one Multiplier circuit, one of two optional Connector circuits per GBL, and one Latch-SA circuit according to an embodiment of the present invention. This diagram is merely an example, which should not unduly limit the scope of the claims. One of ordinary skill in the art would recognize many variations, alternatives, and modifications. As shown, FIG. 4 includes A) a Multiplier circuit, B) a Connector circuit, and C) a Sensing Amplifier circuit. Unlike prior-art NAND scheme, each GBL of the HiNAND provided in the present invention is not directly connected to SA, instead, is connected to a Multiplier first through one dedicated 20V NMOS device MN6 gated by a BIAS control signal.

The Multiplier circuit (section A of FIG. 4) is used to multiply each low input sensing voltage developed and detected at node BLP. The node BLP is connected to each corresponding GBL through the 20V NMOS device MN6 biased into a conduction state. The output voltage at node OUTP is multiplied by a multiplication number M, where M=1, 2, 3 or larger integer number, by the Multiplier circuit depending on a required ΔV for the Latch-SA and sensing speed specification. A Larger M value will result in a larger area of each Multiplier with more number of capacitors such as C[0] through C[M−1]. In other words, a Multiplier with M multiplication includes N number of capacitors such as M=N+1.

Every one of capacitor C[0] through C[M−1] is connected to two LV NMOS pass transistors, MN[M] and MNN[M]. All capacitors of C[0] through C[M−1] are connected in series from the top node OUTP to the bottom node connected to node IN[M]. The values of each capacitor of C[0] to C[M−1] can be made the same or different values. The type of capacitor is preferably made of poly1-poly2 capacitor without a Vt drop for a full coupling effect in this Multiplier's operation.

For example, the top plate of capacitor C[1] is connected to two NMOS transistors. One transistor is MN[1] with its left input node connected to a common node of BLP, its gate tied to T[1] and its right output connected to node IN The other LV NMOS transistor, MNN[1] with its drain node connected to node IN[1], its source node connected to Vss, and its gate tied to TP[1]. The bottom plate of capacitor C[1] is connected to the top plate of next capacitor C[2] (not shown in FIG. 4). The top common sensing line of BLP is connected to a pull-up 20V NMOS device MN6 with its gate tied to a BIAS control signal and its drain node is connected to each corresponding GBL.

Similarly, the top plate of capacitor C[M−1] is connected to another two NMOS transistors. One transistor is MN[M−1] with its left input node connected to a common node BLP, its gate tied to T[M−1] and its right output connected to node IN[M−1]. The other LV NMOS transistor, MNN[M−1] with its drain node connected to node IN[M−1] and source node connected to Vss with gate tied to TP[M−1].

Additionally, the top plate of capacitor C[0] is connected to another two NMOS transistors. One transistor is MN[0] with its left input node connected to a common node BLP, its gate tied to T[0] and its right output connected to node OUTP. While the other NMOS transistor that connects to capacitor C[0] has two options shown in a preferred Connector circuit in section B) of the FIG. 4.

In a specific embodiment, the function of the Connector circuit is to connect the Multiplied voltage output at node OUTP to one of Latch SA input at node QB. Option2 Connector circuit (see FIG. 4) only needs one LV NMOS pass-transistor MN1 with its gate tied to T3P. The input OUTP voltage is fully passed to the node QB without any Vt value drop because the OUTP voltage is preferably set below 0.5V. Thus when T3P is at Vdd, OUTP voltage can be fully passed to node QB.

Option1 Connector circuit (see FIG. 4) comprises two LV PMOS devices such as MP1 with its gate tied to T3B and MP5 with its gate tied to OUTP. Only one option is preferably used between each SA and each Multiplier of the present invention.

Option1 circuit's two PMOS transistors of MP1 and MP5 are used to reversely convert the voltage input at node OUTP to node QB with a voltage of VDDP (or a high Z state). The T3B gate signal is to control the on or off state of MP5. The VDDP voltage is set to be VDDP that substantially equals to OUTP voltage plus MP5's threshold level Vtp. If OUTP is 0.36V, Vtp is 0.7V, then VDDP is set to be about 1.06V.

Optiom2 circuit uses the only one NMOS transistor of MN1 as an isolator between node QB and high capacitive node OUTP during the Latch amplification course. Once OUTP voltage is latched into MP2 node, the gate of T3P would be shut off so that the next DRAM Latch-sensing can be developed from the small detected ΔVt, which is the initial voltage difference between node QB and node Q.

In another specific embodiment, the SA circuit comprises eight LV MOS transistors including three LV PMOS devices and five LV NMOS devices. The three PMOS devices include one common mirror device MP3 and two other devices MP2 and MP4 in the amplifier circuit. The five LV NMOS devices include MN7, MN2, MN3, MN4, and MN5. The MN5's source node is connected to $V_{REF}$ and its gate tied to T3 and its drain node connected to node Q of Latch SA. The drain node of the left NMOS device MN7 is connected to the node QB and its gate connected to a signal RES and its source node connected to Vss.

As shown in section C of FIG. 4, the top PMOS MP3's gate is connected to T4 and the bottom NMOS MN3's gate is connected to T5. The output nodes are either node Q or node QB with a preferred tracking equal junction capacitance for a reliable amplification of small ΔV of sensing signal present at node Q and node QB initially.

In yet another specific embodiment, the operation of the Multiplier is associated with the LBL and GBL structure laid in the HiNAND array that comprises J number of divided Groups for each GBL line. As explained in description of FIG. 3, each GBL metal2 line is replaced by J number of metal1 LBL lines. Both LBL and GBL are laid out in Y-direction in parallel with GBL on top of LBL. The capacitance of each metal1 line of LBL is preferably laid out to be less than 1/J of each metal2 line of GBL. In other words, the Rcap=LBLcap/GBLcap≤1/(J+1).

But for an easier layout in design, each metal1 LBL length in each Group is preferably made to be 1/J of metal2 GBL length. In other words, the following ratio is kept in a design guideline. $R_{length}$=LBL$_{length}$/GBL$_{length}$<1/J. The $R_{length}$ 1/J means that the Rcap at least is about ⅕ if the metal2 line is one top of the metal1 line with a twice thicker oxide, thus the smaller capacitance per micron. Similarly, $R_{length}$=1/20 means that the Rcap is about 1/10 when oxide thickness is taken into consideration. Note, $R_{length}$=1/20 means each GBL is divided into 20 Groups. For a digital division, each metal2 line of GBL is preferably divided into 16 metal1 lines of LBLs for 16 Groups. Thus, Rcap is about ⅛. Definitely, if the parasitic capacitances between any two adjacent metal1 LBLs and any two adjacent metal2 GBLs are taken into consideration, then Rcap will be increased, depending on the layout design rule. The reason of the increased Rcap is due to the increase of capacitance of metal1 LBL that adds two extra adjacent parasitic capacitances between two adjacent LBLs. Of course, the above analysis merely gives some quantitative changes in Rcap but does not change the novel nature of reducing the local bit line capacity by dividing the GBL to multiple groups for reducing precharge power consumption and latency to perform faster Read and Program-Verify operations.

Referring to the Multiplier circuit in section A of FIG. 4, this circuit is used to implement one embodiment of the present invention based on the HiNAND architecture for Read operation or Verification of Program and Erase operations. In the conventional NAND, the NAND String is long, thus the resistance of up to 1 MΩ is very common. Regular current sense to convert the NAND cell's Vt to an output voltage is not commonly used because SA's output voltage of sensing the On-state cell is the ratio of PMOS pull-up load resistance to the high-resistance of a long NAND String having at least 32T NAND cells plus two String select transistors. Unless the resistance of the PMOS load device is more than 5× of the NAND String resistance, the On-state NAND cell cannot be accurately sensed by the proper ratio of resistance between the Pload and the String resistance. But to make the PMOS load resistance 5× of each long NAND String, it is technically difficult and not practical because that would have the Pload a value of above 5 MΩ range. Therefore, the common sensing circuit is to utilize a precharge BL scheme in the first state of SA. In this sensing scheme, the PMOS load is turned on to precharge each high GBL metal capacitance (in a range of 3-5 pf) with a desired voltage, $V_{GBL}$. The required precharge time depends on the value of each GBL capacitance, the PMOS device resistance of Rload and $V_{BL}$ voltage level. The precharge peak current of each GBL, Ipc=$V_{GBL}$× $C_{GBL}$/$t_{PC}$, where $t_{PC}$ is the precharge time. Normally, the Rload is made smaller to achieve a faster precharge speed.

In the conventional NAND Read operation, the GBL precharge current comes from the PMOS device MP1 through a 20V NMOS device MN3 to BLe line or MN4 to BLo line as shown in FIG. 1. In order to limit the voltage level of $V_{GBL}$ for reducing the precharge current, the gate voltage of BLSHF has to be raised to a highest value of 2.1V along with $V_{GBL}$=0.9V during GBL precharge cycle and then drops to a lower value of 1.3V at GBL sensing cycle to ensure the lowest voltage $V_{GBL}$<0.3V, which is much lower than the Vt of NMOS sensing device with Vt=0.7V with a margin of 0.4V.

In another conventional design, the $V_{GBL}$ is charged to Vdd that consumes too much current per GBL line. In a more recent NAND design, $V_{GBL}$ has been reduced to $V_{GBL}$=0.9V. If Vdd=1.8V, then this voltage reduction of $V_{GBL}$ from 1.8V to 0.9V results in a precharge-current been halved.

In addition, the higher the precharged $V_{GBL}$ voltage, the longer discharged time required when the NAND cell's Vt is detected below $V_{RD}$. In other words, this leads to the longer Read latency and higher Read-induced wordline (WL) disturbance on the un-selected 31 WLs of a 32T NAND String NAND flash memory. It is improvement but at the expense of more complicate design of the gate BLSHF signal control in precharge and discharge of whole Read cycle.

In particular, an embodiment of the present invention provides more reduction of precharge current by drastically reducing the $V_{GBL}$ voltage from 0.9V to 0.2V or lower. Provided with the $V_{GBL}$ voltage reduction from 0.9V to 0.2V, the precharged current is then reduced to 0.2V/0.9V=22.2%. This is about 77.8% saving in the precharge current. If the $V_{GBL}$ voltage reduction is from 0.9V to 0.1V, then the precharged current is reduced to 11.1%. The saving of power consumption of the precharge current is up to 88.9%. Whether 0.1V or 0.2V or even 0.3V is chosen for the $V_{GBL}$ voltage is a design tradeoff between the combined performance of HINAND array Rcap, Multiplier capability, DRAM-like Latch-SA gain, and layout area of the present invention.

For example, if SA's safe-gain $\Delta V_{SA}$ of its two input signals is 0.2V with device-mismatch factor being taken into consideration, the Multiplier has to generate at least 0.4V output voltage to one of SA's input with another input coupled with a reference signal $V_{REF}$ being set to a middle value of 0.2V. For example, if $V_{GBL}$=0.1V, the Multiplier has to quadruple the signal from 0.1V to 0.4V. That means Multiplication=4. Note, $\Delta V_{SA}$ is defined as the voltage difference between two inputs, Q and QB, of each DRAM-like SA of the present invention.

In an example, for Vdd=1.8V operation, one of the optimal tradeoff is to set $V_{GBL}$=0.18V, Multiplication=3 and $V_{REF}$ is set to 0.27V and Rcap~1/10. Then $\Delta V_{SA}$=0.18V×3−0.27V=0.27V, which is a safer margin for a reliable sensing with the SA.

How to reduce Rcap has been shown in the previous section of the specification in association with the HiNAND array architecture disclosure. The simple guideline is to make Rcap=(LBL metal1 length)/(GBL metal2 length)≤1/10 to reduce power consumption and precharge time by roughly one order of magnitude. The true Rcap value needs to be characterized from empirical data measured in an actual product of NAND array.

As a specific example with Multiplication=3 being chosen for the Multiplier circuit design (FIG. 4), the HiNAND Read operation is illustrated below.

Provided that Multiplication M=3, then total number of capacitors needed for the Multiplier circuit is 3, which includes C[0], C[1] and C[2] from top to the bottom in section A of FIG. 4. Each capacitor C[M] is connected to a NMOS LV switch transistor, MN[M], that shares one common sensing node of BLP, which is connected to a GBL through one corresponding same 20V NMOS device MN6 with its gate tied to a BIAS control signal, drain node tied to the GBL and source node tied to the BLP. Each GBL is a highly capacitive node connected to a long global metal2 line with a value ranging in 3-5 pf.

The input node of Multiplier circuit is BLP and its output node is OUTP, which is the top capacitor plate of C[0]. The bottom plate of C[0] is connected to the top plate of C[1].

Similarly, the bottom plate of C[1] is connected to the top plate of C[2] for a Multiplier of 3×-voltage multiplication. Finally, the bottom plate of C[2] is connected to Vss. Each top plate node of the C[1] and C[2] is respectively connected to NMOS pull-down devices MNN[1] and MNN[2] with individual gate tied to TP[1] and TP[2], etc.

During the precharge Read cycle, each LBL capacitor is precharged to 1.8V Vdd initially with a selected NAND String in non-conduction state by grounding one of the String-select transistors (e.g., MSo and MSe on top or MGo and MGe on bottom) with all 31 unselected WLs applied with Vpass of 6V and one selected WL coupled with $V_{RD}$ in a marginal range of 0V to 0.5V. After all LBLs of one selected Group are fully charged to $V_{LBL}$=1.8V and Vpass and VRD attain their required level after some predetermined precharged time, all LBLs are either discharged or sustained by turning on all MSo, MSe, MGo, and MGe. The final $V_{LBL}$ is fully determined by the Vts of the selected NAND cells. If the NAND cell Vt is below $V_{RD}$, it conducts and the BLP voltage is discharged to Vss, thus $V_{GBL}$=$V_{BLP}$=0V. Conversely, if the NAND cell Vt is still larger than $V_{RD}$, it would not conduct and BLP and GBL voltage is retained as $V_{GBL}$=$V_{BLP}$~1/10VLBL=0.18V (the preset value for GBL after charge-sharing).

Once the above two possible voltages of Vss and 0.18V are presented to the input node, BLP, of each Multiplier. The Vpass and $V_{RD}$ can be shut off or maintained to the selected NAND String in the selected NAND Group. If the shutoff is the selected option, then the 32 WL stress can be stopped. If the Vpass and $V_{RD}$ voltages are still retained, then the WL stress on the selected NAND String of the selected NAND Group would be continued. But since the time for operating Multiplier and the subsequent DRAM-like Latch-SA sensing is within 1 μs, thus either way can be flexibly used but it should be determined later from the best NAND reliability performance perspective in real silicon.

When $V_{GBL}$=$V_{BLP}$=0V is presented to at the input node BLP of the Multiplier, the output voltage at output node OUTP is still 0V. In other words, if Multiplication M=3, then from the simple equation, the OUTP node voltage $V_{OUTP}$=3×$V_{BLP}$. When $V_{BLP}$=0V, then $V_{OUTP}$=0V. When $V_{BLP}$=0.18V, then $V_{OUTP}$=3×0.18V=0.54V at output node OUTP.

Figure 8:
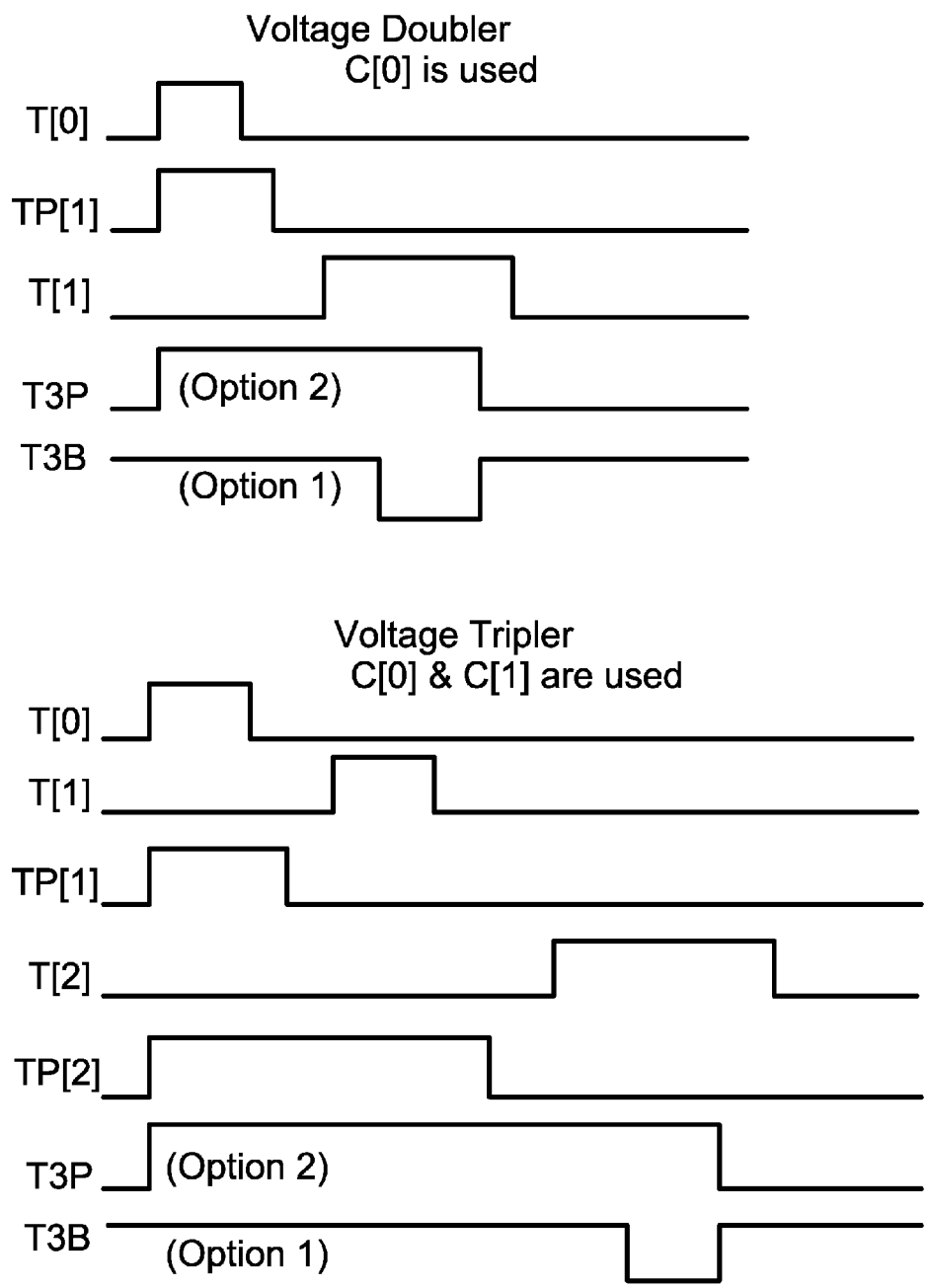
FIG. 8 shows two timing control waveforms for operating the preferred Multipliers according to an embodiment of the present invention.

Now how to increase 3 times of 0.18V from each input node BLP to output node OUTP is illustrated in terms of control timing waveforms of the Multiplier as a Voltage Tripler. FIG. 8 shows two timing control waveforms for operating the preferred Multipliers. The top portion of FIG. 8 shows timing control waveforms used for Multiplication M=2 as to make the Multiplier a Voltage Doubler. The bottom portion of FIG. 8 shows timing control waveforms used for Multiplication M=3 as to make the Multiplier a Voltage Tripler. Note, the process of Multiplication M=2 associated with the Voltage Doubler is merely part of that of Multiplication M=3 associated with the Voltage Tripler but having a simpler timing control waveforms, thus the function of the Voltage Doubler is substantially within the same spirit of the circuit of general Multiplier disclosed in the present invention.

Using the Voltage Tripler as an example, for achieving Multiplication of 3, it needs three Multiplier cycles including control gates of T[0], T[1], and T[2] associated with TP[1], TP[2] and TP[3] for Option2 Connector circuit but an extra fourth cycle of T3B for Option1 Connector circuit. In a specific embodiment, as seen in section A of FIG. 4, the first multiplier cycle includes only capacitor C[0] which is selectively charged by grounding IN[1] to 0V and turning on NMOS device MN[0] by respectively coupling gates T[0] and TP[1] to Vdd. The NMOS devices MN[1] and MN[2] are in a shut-off state by setting both gates T[1] and T[2] to Vss.

Since $V_{BLP}$ is only 0.18V, thus coupling gate T[0] to Vdd can fully pass the 0.18V from BLP node to OUTP node without any voltage drop. Coupling gate TP[1] to Vdd can fully pull down IN[1] to Vss. After the first cycle, the OUTP node is at 0.18V along with IN[1] and IN[2] at a floating state. Note, the gate TP[1] switches from Vdd to Vss only after gate T[0] is fully discharged to Vss with a Δt margin for a reliable boost to 2× value. The Δt≥30 ns is safe enough. Similarly, gate T[1] only switches to Vdd after gate TP[1] switches from Vdd to Vss with a Δt≥30 ns margin. Gate T[2] switches from Vss to Vdd only after gate T[1] switches from Vdd to Vss with a Δt≥30 ns. Gate TP[2] can switch from Vss to Vdd simultaneously with T[0], TP[1], and T3P when gate T[1] is at Vss.

Additionally in the second multiplier cycle, M=2, gate T[1] signal is used to charge the source of C[0] to boost OUTP node to a 2× voltage value (see section A of FIG. 4). Only C[1] is selectively charged by grounding IN[2] to 0V and turning on NMOS device MN[1] by coupling gates T[1] and TP[2] to Vdd. The NMOS devices of MN[0] and MN[2] are in shut-off state by grounding both gates T[0] and T[2] to Vss.

Since $V_{BLP}$=0.18V only, thus coupling gate T[1] to Vdd can fully pass 0.18V from BLP node to IN[1] node without any voltage drop. Coupling gate TP[2] to Vdd can fully pull down IN[2] to Vss. After the second cycle, the OUTP is at 0.36V, boosted by IN[1] at 0.18V along with but IN[2] at a floating state.

Further, in the third multiplier cycle: Gate T[2] signal is used to charge the source of C[2] of IN[2] to BLP value and then to boost OUTP node to a 3× voltage value of BLP. Only C[2] is selectively charged by floating both IN[1] and IN[2]. In other words, IN[1] and IN[2] are at a floating state by shutting off both MNN[1] and MN[2] with gates TP[1] and TP[2] being at Vss to disconnect MNN[1] and MNN[2]. Both MN[0] and MN[1] are turned off by setting gates T[0] and T[1] to Vss. After the third cycle, the OUTP node is at 0.54V boosted by IN[2] at 0.18V with IN[1] at 0.36V.

If higher voltage at OUTP node is required, then more multiplier cycles (M>3) is required at expense of increase in capacitor size. So, design trade-off needs to be considered.

Next, the output voltage of Multiplier is fed into one of a real output node of QB of SA to be compared against another output node, Q, coupled with a $V_{REF}$ through a Connector circuit selected from either an Option1 Connector circuit or an Option2 Connector circuit (see section B of FIG. 4).

In an embodiment, Option2 Connector circuit comprises a NMOS device MN1 only. Initially, the Latch of the SA (section C of FIG. 4) is reset to make QB node at Vss by coupling a pulse of RES to Vdd. After resetting period, the RES is returned to Vss. The function of the Option2 Connector circuit is just a pass transistor NMOS LV device MN1 with its gate tied to T3P. Its function is used to fully pass the OUTP voltage to QB node initially. After latching the OUTP voltage at QB node and latching $V_{REF}$ at Q node, then MN3, MN7 and MN5 are shut off into a high Z state so that the subsequent Latch circuit can develop and amplify the sensing voltage difference from two following conditions provided that the Option2 Connector circuit is used:

1) Initial ΔV1=0.54V (QB)–0.27V (Q)=+0.27V, if the selected NAND cell's Vt is above $V_{RD}$ as an Off-cell and the effective capacitance at OUTP node is much larger than the total capacitance at QB node including the gate capacitance of MP4 and MN4. The final result is QB node at Vdd and Q node at Vss after the SA development.

2) Initial ΔV2=0–0.27V=–0.27V, if the selected NAND cell's Vt is below $V_{RD}$ as an On-cell. The final result is QB node at Vss and Q node at Vdd after the SA development.

But in reality to make the $V_{QB}$=$V_{OUTP}$ for 100% charge-sharing, the size of each capacitor C[0], C[1], and C[2] has to be made large. That would result in the layout size overhead.

In another embodiment, Option1 Connector circuit comprises two PMOS devices MP1 and MP5 connected in series. Initially, the Latch is also reset to make QB node at Vss by coupling a pulse of RES to Vdd. After resetting period, the RES is returned to Vss. The function of the Option1 Connector circuit is like an Inverter but the PMOS power supplied voltage is not at Vdd but at VDDP. The value of VDDP is preferably set to be an OUTP high voltage 0.54V plus threshold level of PMOS device MP5 Vtp 0.7V, leading to a VDDP voltage of about 1.24V.

When voltage of OUTP node is at 0.54V, then MP5 is turned off into a high Z state. Thus the VDDP node is disconnected from QB node and becomes floating out of circuit when T3B is coupled Vss.

When voltage of OUTP node is at 0V, then MP5 is fully turned on into a conducting state. Thus the VDDP voltage is coupled to QB node when T3B is at Vss to turn on the PMOS device MP1. In this case, the voltage drop due to the concern of charge sharing between OUTP node and QB node becomes no issue. The subsequent Latch circuit can develop and amplify the sensing voltage difference from two following conditions provided that the Option1 Connector circuit is used:

1) Initial ΔV3=VDDP (QB)–0.6V (Q)=1.24V–0.6V=0.64V, if the NAND cell's Vt is above $V_{RD}$ as an On-cell to have OUTP=0V to turn on MP1. Note, in this option $V_{REF}$=VDDP/2=0.6V. This performance is better than Option2 case because ΔV3>ΔV1. After Latch SA development, QB node will be at Vdd and Q node will be at Vss.

2) Initial ΔV4=0–0.6V=–0.6V, if the NAND cell's Vt is below $V_{RD}$ as an Off-cell to have OUTP=0.54V to turn off MP1. Thus, QB node will be at Vss and Q node will be at Vdd after the SA development.

The Latch SA development will be further explained below. The preferred ΔV development is divided into 3 steps. In a first step, the Latch is reset to make QB node at Vss by turning on MN7 with an one-shot Vdd pulse on gate RES but Q node at $V_{REF}$ by turning on MN5 along with both MP3 with gate T4 being set at Vdd and MN3 in off-states with gate T5 at Vss. Also gate T3B is set to Vdd to turn off MP1. In a second step, the Latched QB node is connected to VDDP by turning on MP1 with T3B being set at Vss. If OUTP node is at Vss, then QB node is latched at VDDP voltage. If OUTP node is at 0.54V, then MP5 will be turned off. Thus QB node remains at Vss (the initial value in the first step). In a third step, which is a Latch development period, turning on MN3 first and MP3 later fully amplifies QB node and Q node respectively to either Vdd and Vss or Vss and Vdd. This is substantially the same as DRAM-like sensing, which is well known and would not be described further here.

Figure 5:
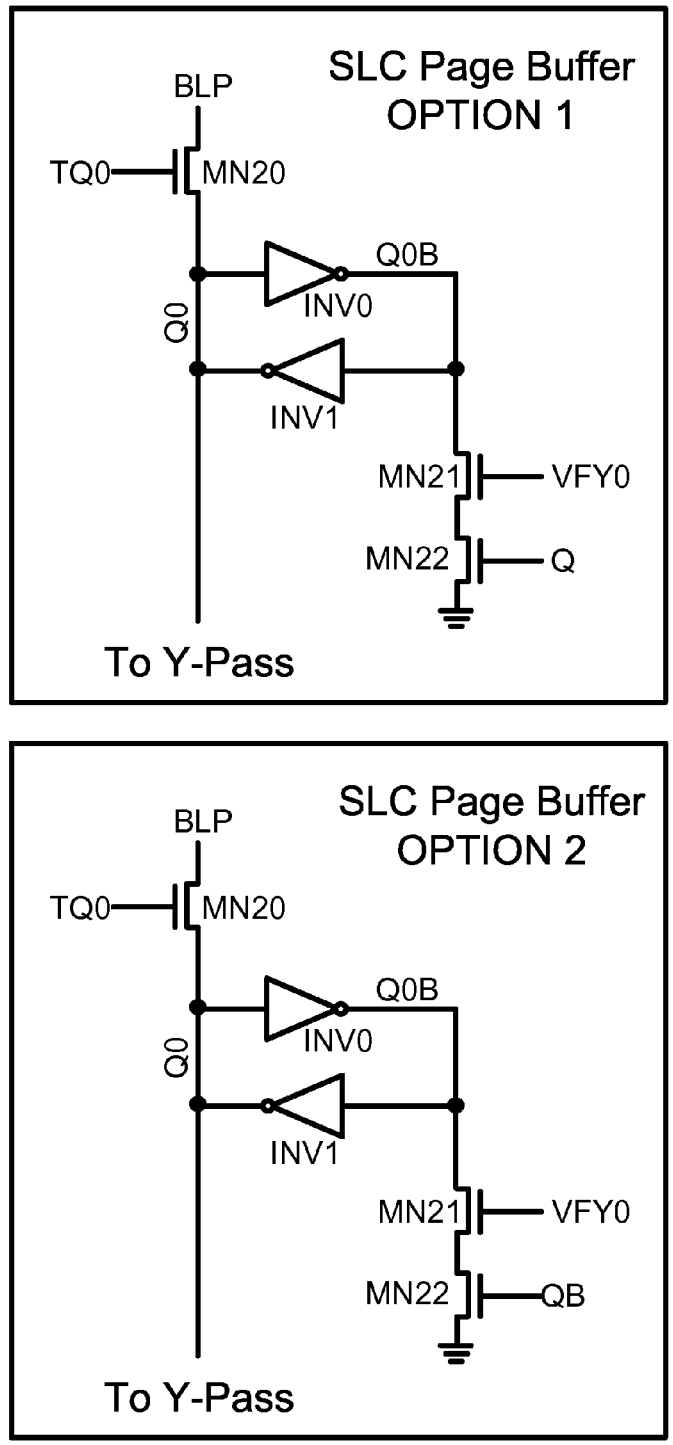
FIG. 5 shows one bit of two different preferred circuits of SLC Latches working with two optional Connectors but one common Multiplier of the SA and Page Buffer as seen in FIG. 4 for the HiNAND array shown in FIG. 3.

Furthermore, HiNAND Read operation with one-bit per cell SLC storage type is illustrated in terms of transferring logic states represented by Vdd/Vss levels at QB and Q nodes of the Latch SA to bit of a SLC Page Buffer. FIG. 5 shows one bit of two different preferred circuits of SLC Latches working with two optional Connectors but one common Multiplier of the SA and Page Buffer as seen in FIG. 4 for the HiNAND array shown in FIG. 3. This diagram is merely an example, which should not unduly limit the scope of the claims. One of ordinary skill in the art would recognize many variations, alternatives, and modifications.

As shown in FIG. 5, there are two options for the one bit (SLC) Latch of Page Buffer for HiNAND Read operation (as well as and Program and Program-Verify operation). In an embodiment, an Option1 SLC Page Buffer circuit (see upper section of FIG. 5) comprises one Latch with two Inverters such as INV0 and INV1, and three NMOS devices MN20, MN21, and MN22. TQ0 node is tied to gate of MN20. Q0 node of Latch is tied to the source node of MN20. The Input node BLP is connected to the drain node of MN20. MN21 has its gate tied to VFY0 and MN22 has its gate tied to Q node, while the Q0B node of Latch is tied to the drain node of MN21.

Initially in Program-Verify or Read operation, the Latch is reset to set Q0 node at Vss and Q0B node at Vdd when BLP is at Vss and TQ0 is at Vdd. But BLP at Vss is set by making both T[M] and TP[M] at Vdd in the Multiplier circuit as seen in section A of FIG. 4.

When NAND cell's Vt is sensed below $V_{RD}$, then Q node is at Vdd in Latch SA of FIG. 4. That means the NAND cell Vt is detected to set Q node at Vdd which turns on transistor MN22 of Latch circuit in the SLC Option1 Page Buffer circuit. When setting VFY0 to Vdd, the Latch of the Page Buffer would be set to have Q0B node connected to ground at Vss, then Q0 node is latched to Vdd.

If this is associated with a Program-Verify operation, then the NAND cell A-state Vt has been programmed to the desired value. Therefore, the further program pulse has to be stopped and the Program operation is finished. If the programmed Vt value is still below the design value, then Q node is at Vss and MN22 is off, thus the Latch of Page Buffer cannot be set from the initial reset status. Thus, the program step has to be continued until the programmed Vt meeting the spec.

If this is associated with a Read operation, then the NAND cell's stored Vt has been identified to set Q0 node at Vdd to automatically inform the system of the stored Vt. But if Q0 node is at Vss, then the selected WL's $V_{RD}$ value has to be increased to a next level for further Vt verification in the Read operation. For SLC Read, there is only one level of $V_{RD}$, thus after one Read operation, the data of either 1 or 0 would be identified. No more $V_{RD}$ to be applied for next verification.

In another embodiment, an Option2 SLC Page Buffer circuit (lower section of FIG. 5) comprises one Latch with two Inverters such as INV0 and INV1, and three NMOS devices: MN20, MN21, and MN22. MN20 has its gate tied to TQ0, MN21 gate tied to VFY0, and MN22 gate tied to QB node. The Q0 node of Latch is tied to the source node of MN20, while the Q0B node of Latch is tied to the drain node of MN21. The Input node is BLP is connected to the drain node of MN20.

The only difference between Option1 and Option2 Page Buffer circuits is the gate signal polarity of the transistor MN22. In Option1, MN22 gate is tied to Q node, while in Option2, MN22's gate is tied to QB node. The reason MN22 gate signal has a different polarity in above two Options because the input of BLP voltage is reversed by the two options of Connector circuit shown in section B of FIG. 4 as explained previously.

Figure 7A:
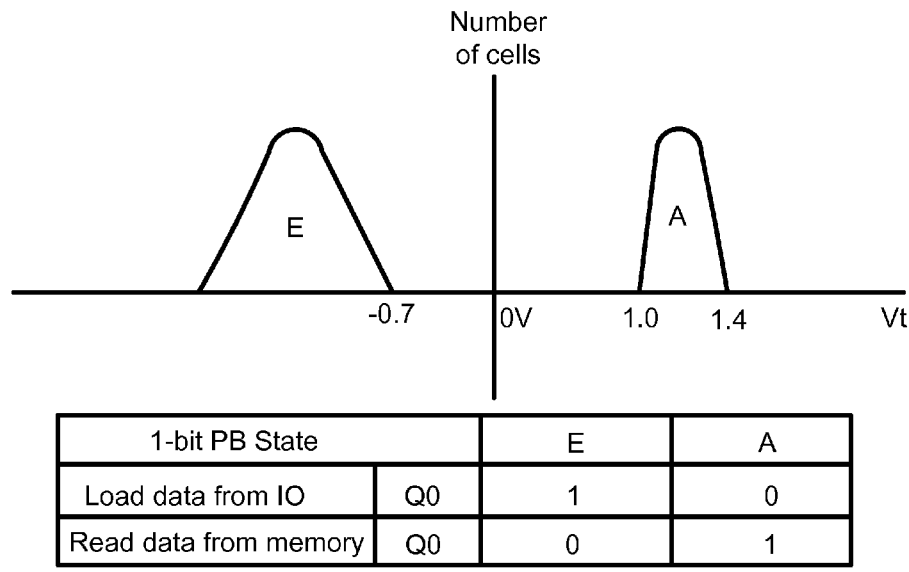
FIG. 7A shows two preferred Vt distributions for a SLC storage of the HiNAND cell according to an embodiment of the present invention.

The detailed operation of the Option2 SLC latch is similar to Option1 SLC latch described above. The Latch of the SLC Page Buffer circuit, regardless of Option1 or Option2, can store only one bit of data from the selected NAND cell with their respective inputs connected to BLP associated with each Multiplier from each corresponding GBL of a HiNAND array. FIG. 7A shows two preferred Vt distributions for a SLC storage of the present HiNAND cell. The erased Vt distribution is a negative value below −0.7V and is referred as E-state.

The programmed Vt distribution is a positive value above 1.0V and is referred as A-state. In Latch SLC binary value logic definition of the present invention, when loading data from IO (i.e, external by program operation via Y-pass gate), Q0 logic value=1 is defined for E-state, while Q0 logic value=0 is for A-state. The sum of the pull-down resistance of two transistors MN21 and MN22 has to be made smaller than the pull-up resistance of one PMOS device in INV0 with gate tied to Vss to flip when Q node is at Vdd in Option1 or QB node is at Vdd in Option2 of SLC Latch circuit. In the HiNAND Read operation, regardless of Option1 or Option2 SLC Latch/connection, loading data from the memory cell at an E-state (Vt is lower than $V_{RD}$ as an On-cell) will result in a Vss level latched to the Q0 node of the page buffer to give a logic value=0, loading data from the memory cell at an A-state (Vt is greater than $V_{RD}$ as an Off-cell) will result in a Vdd level latched to the Q0 node of the page buffer to give a logic value=1.

Figure 6:
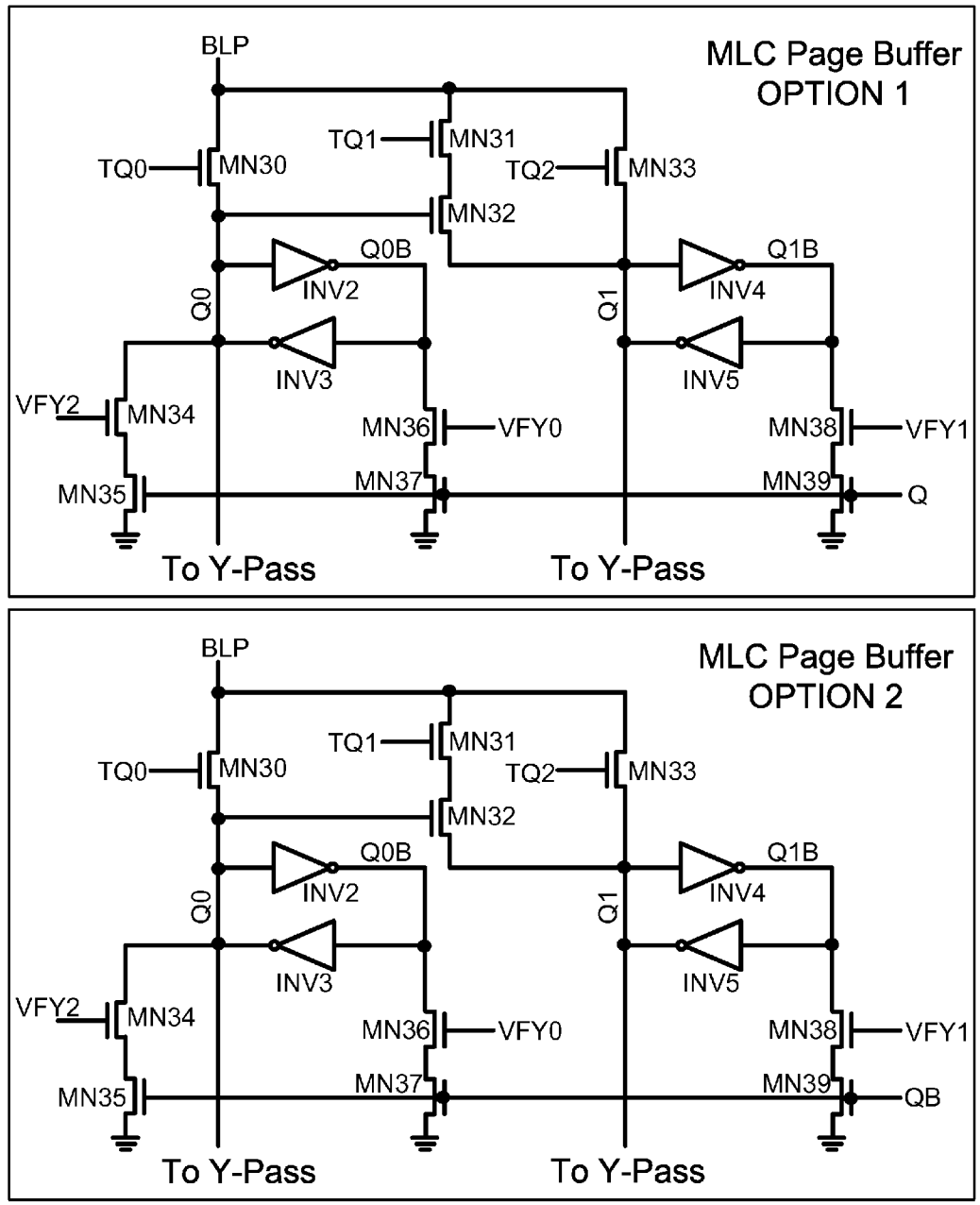
FIG. 6 shows two bits of two different preferred circuits of MLC Latches working with two optional Connectors but one common Multiplier of the SA and Page Buffer as seen in FIG. 4 for the HiNAND array shown in FIG. 3.

In yet another embodiment, the same HiNAND array can be applied for MLC storage type and the corresponding circuits and operations of the MLC Page Buffer of the present Invention are explained below. FIG. 6 shows two bits of two different preferred circuits of MLC Latches working with two optional Connectors but one common Multiplier of the SA and Page Buffer as seen in FIG. 4 for the HiNAND array shown in FIG. 3. This diagram is merely an example, which should not unduly limit the scope of the claims. One of ordinary skill in the art would recognize many variations, alternatives, and modifications.

As shown in FIG. 6, there are also two MLC options for one bit Latch of Page Buffer in HiNAND Read operation and Program-Verify operations. In a specific embodiment, an Option1 MLC Page Buffer circuit (top section of FIG. 6) comprises two Latches with each made of two Inverters. The first Latch is made of Invertors INV2 and INV3 with respective output node Q0B node and Q0 node and four NMOS devices MN34, MN35, MN36, and MN37. MN34 has its gate tied to signal VFY2. MN36 has its gate tied to signal VFY0. The gates of MN35 and MN37 are tied to a common signal of Q node and their respective drains are connected to the respective source nodes of MN34 and MN36.

The Q0 node of the first Latch is tied to the source node of another NMOS transistor MN30 gated by TQ0 and drain node connected to Input node BLP, while the Q0B of the Latch is tied to the drain node of MN36.

The second Latch is made of two Invertors INV4 and INV5 with respective output nodes Q1B and Q1 but only two additional NMOS devices MN38 and MN39. MN38 has its gate tied to signal VFY1 and drain node tied to Q1B node. MN39 has its gate tied to Q node and has grounded its source node. Besides, there are two NMOS devices MN31 and MN32 connected in series with top drain node of MN31 connected to BLP and the bottom node of MN32 connected to Q1 node of the Second Latch. MN31 gate is tied to signal TQ1 and MN32 gate is tied to Q0 node of the first Latch. Q0 node and Q1 node are connected to Y-pass transistors (not shown). In Option1, the two Latches of MLC Page Buffer are working with the Option1 Connector circuit shown in section B of FIG. 4.

In Program-Verify operation or Read operation, both Latches are initially reset to make Q0 node at Vss and Q0B node at Vdd for the first Latch and to make Q1 node at Vss and Q1B node at Vdd for the second Latch when BLP is at Vss and gates TQ0 and TQ2 are applied to Vdd but gate TQ1 is at Vss. Note, BLP is set to Vss by similar approach making gate signals T[M] and TP[M] at Vdd in the Multiplier circuit shown in section A of FIG. 4.

Figure 11:
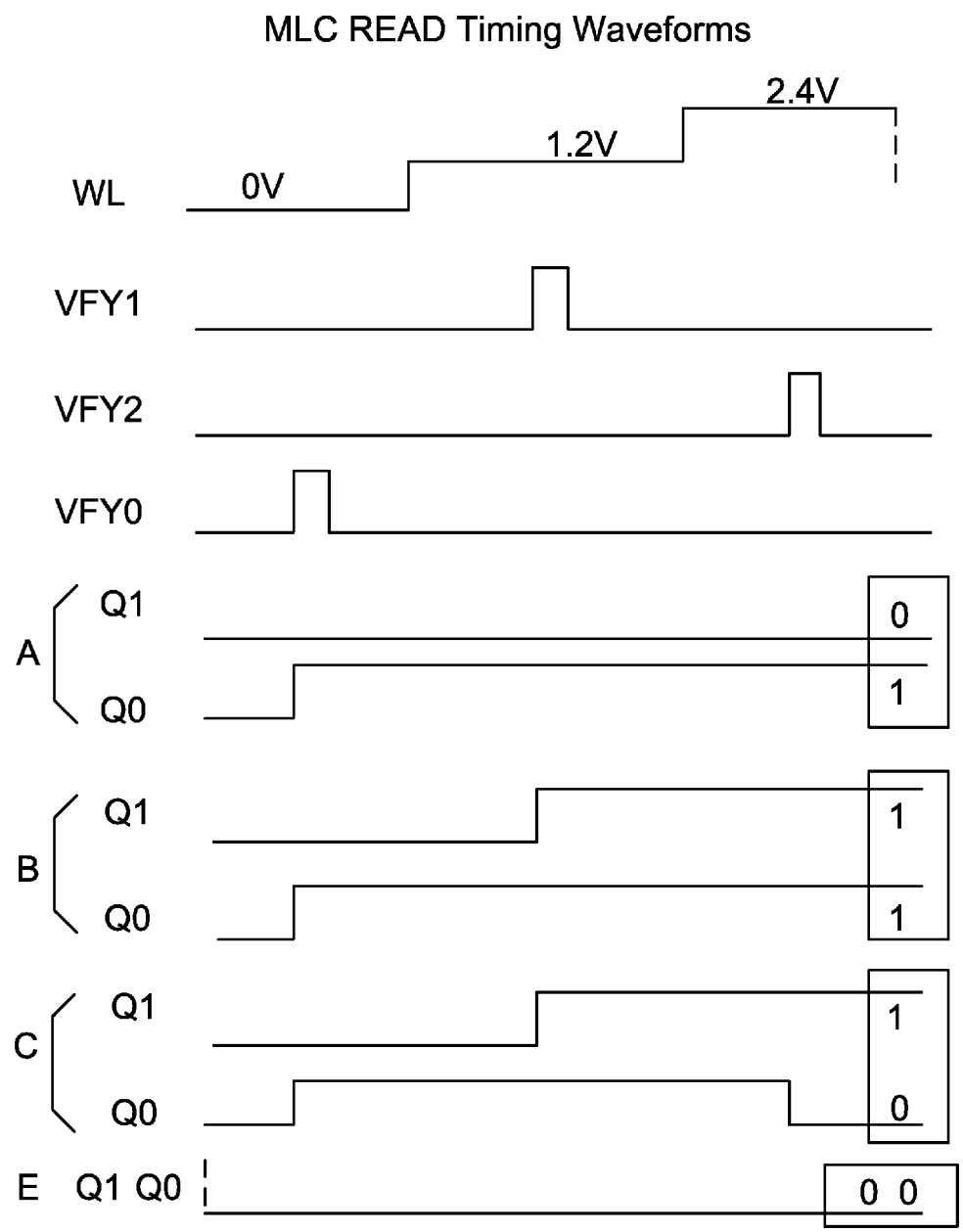
FIG. 11 shows the preferred MLC Read Timing Waveforms for the HiNAND array shown in FIG. 3.

FIG. 11 shows the preferred MLC Read Timing Waveforms for the HiNAND array shown in FIG. 3. The preferred WL $V_{RD}$ voltage is set as a rise-step form with three voltage levels to distinguish one E-state, and three Program states of A-state, B-state, and C-state with Vt distributions and logic assignments as defined in FIG. 7B. When corresponding NAND cell's Vt in a lower page of MLC cell is sensed below first $V_{RD1}$ voltage, then the Q node is at Vdd in the Latch SA (see section C of FIG. 4). That means the NAND cell's Vt is detected to set Q node at Vdd. This would turn on transistors of MN35 and MN37 of the first Latch and MN39 of the second Latch in the MLC Option1 circuit shown in upper section of FIG. 6. During the lower page Vt verification, the signal VFY0 is set to Vdd to set Q0B node at Vss in first Latch, but both control signals VFY1 and VFY2 are set to Vss so Q1 node in the second Latch still preserves its initial reset value at Vss. Note, the first check is to distinguish between E-state and A-state as defined in FIG. 7B.

Figure 7B:
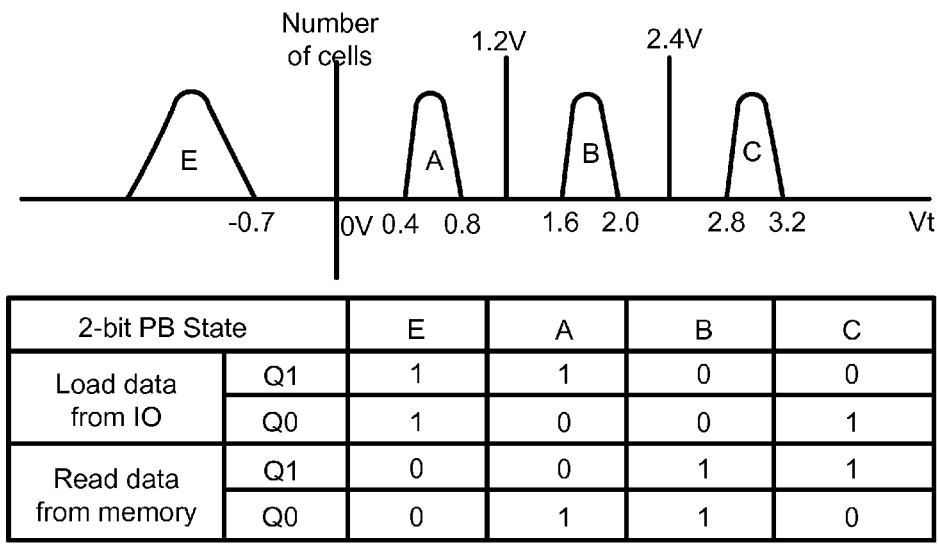
FIG. 7B shows four preferred Vt distributions for a MLC storage of the HiNAND cell according to an embodiment of the present invention.

In a specific embodiment, FIG. 7B shows four preferred Vt distributions for a MLC storage of the HiNAND cell according to the present invention. The erased Vt distribution is a negative value below −0.7V and is referred as E-state. The first preferred programmed Vt distribution is a lowest positive value defined between 0.4V and 0.8V and is referred as A-state. The second preferred programmed Vt distribution is a medium positive value defined between 1.6V and 2.0V is referred as B-state. The third preferred programmed Vt distribution is a highest positive value defined between 2.8V and 3.2V is referred as C-state.

In a specific embodiment, the Latch logic MLC value definition from IO (i.e., program operation via Y-pass gates) is: E-state: Q1=1, Q0=1; A-state: Q1=1, Q0=0; B-state: Q1=0, Q0=0; C-state: Q1=0, Q0=1. While in the HiNAND Read operation for loading data from the memory cell with pre-programmed MLC-type storage, the WL voltage is moving from lower $V_{RD1}$ and rising step-wise to $V_{RD2}$, and further to $V_{RD3}$, to sense and verify different states, E, A, B, C. In the end, after latch SA development and transferring into the MLC page buffer (FIG. 6), the logic values of the two data nodes Q1 and Q0 would be given as: E-state Q1=0, Q0=0; A-state Q1=0, Q0=1; B-state Q1=1, Q0=1, and C-state Q1=1, Q0=0, regardless of the Option1 or Option2 Latch/Connection being used.

Similarly, when moving to a higher next Vt of B-state verification or reading, the $V_{RD2}$ voltage in the selected WL would be coupled to a next higher value for the B-state Vt check with the conditions of setting one control signal VFY1 to Vdd but two other control signals VFY0 and VFY2 to Vss.

If this is the Program-Verify operation, then the NAND cell Vt has been programmed to the desired B-state value. Therefore, the further program pulse has to be stopped and Program operation is finished. If the programmed B-state Vt value is still below the design value, then Q node remains at Vss, thus both Latches cannot be set from the previous state done by the A-state Vt check. Thus, the program step has to be continued until the programmed B-state Vt value meeting the desired spec when Q node becomes Vdd again.

If this is the Read operation, then the NAND cell's stored B-state Vt has been identified to set Q1 node at Vdd in the second Latch to automatically inform the system of the stored Vt value. But if Q1 node is at Vss, then the selected WL's $V_{RD}$ has to be increased to the next value for further Vt verification in this Read operation.

For next C-state Read or Program-Verification, the process is repeated as A-State check and B-State check above with one difference that is to make signal VFY2 at Vdd but both VFY0 and VFY1 at Vss for C-State Vt check.

For a MLC Read operation, there are three $V_{RD}$ values for Read verification. Thus after one MLC Read cycle, both the first Latch and the second Latch would be set to the desired value as defined in FIG. 7B.

In still another embodiment, Option2 MLC Page Buffer circuit also comprises two Latches as the Option1 MLC Page Buffer circuit for the 4-state MLC storage per one physical NAND cell bit. The only difference between the Option1 circuit and the Option2 circuit is the gate polarity of NMOS transistors MN35, MN37 and MN39 being replaced by QB node (see lower section of the FIG. 6). In the Option1 circuit, three gates of MN35, MN37 and Mn39 are commonly tied to Q node (see upper section of FIG. 6). Accordingly, this Option2 MLC Page Buffer circuit with two Latches is working with the Option2 Connector circuit shown in FIG. 4.

Again, the reason to replace Q by QB with a different polarity in above two MLC Page Buffer Options because the input of BLP voltage is reversed by the two Options of Connector circuit shown in section B of FIG. 4 as explained previously.

The detailed description for the Option2 MLC latch operation is similar to that for the Option1 MLC latch above. Each Latch of MLC Page Buffer circuit, regardless of Option1 or Option2, can store two bits of data per one physical NAND bit with their respective inputs connected to BLP associated with each Multiplier from each corresponding HiNAND GBL. The sum of the pull-down resistance of NMOS devices MN34 and MN35, or MN36 and MN37 or MN38 and MN39 have to be made smaller than one corresponding pull-up resistance of PMOS device in two Invertors INV2 and INV3 in the first Latch and two Inventors NV4 and INV5 of the second Latch with gates tied to Vss to flip when Q node at Vdd in Option1 MLC Latch circuit (upper section of FIG. 6) or QB node at Vdd in Option2 MLC Latch circuit (lower section of FIG. 6).

Figure 9:
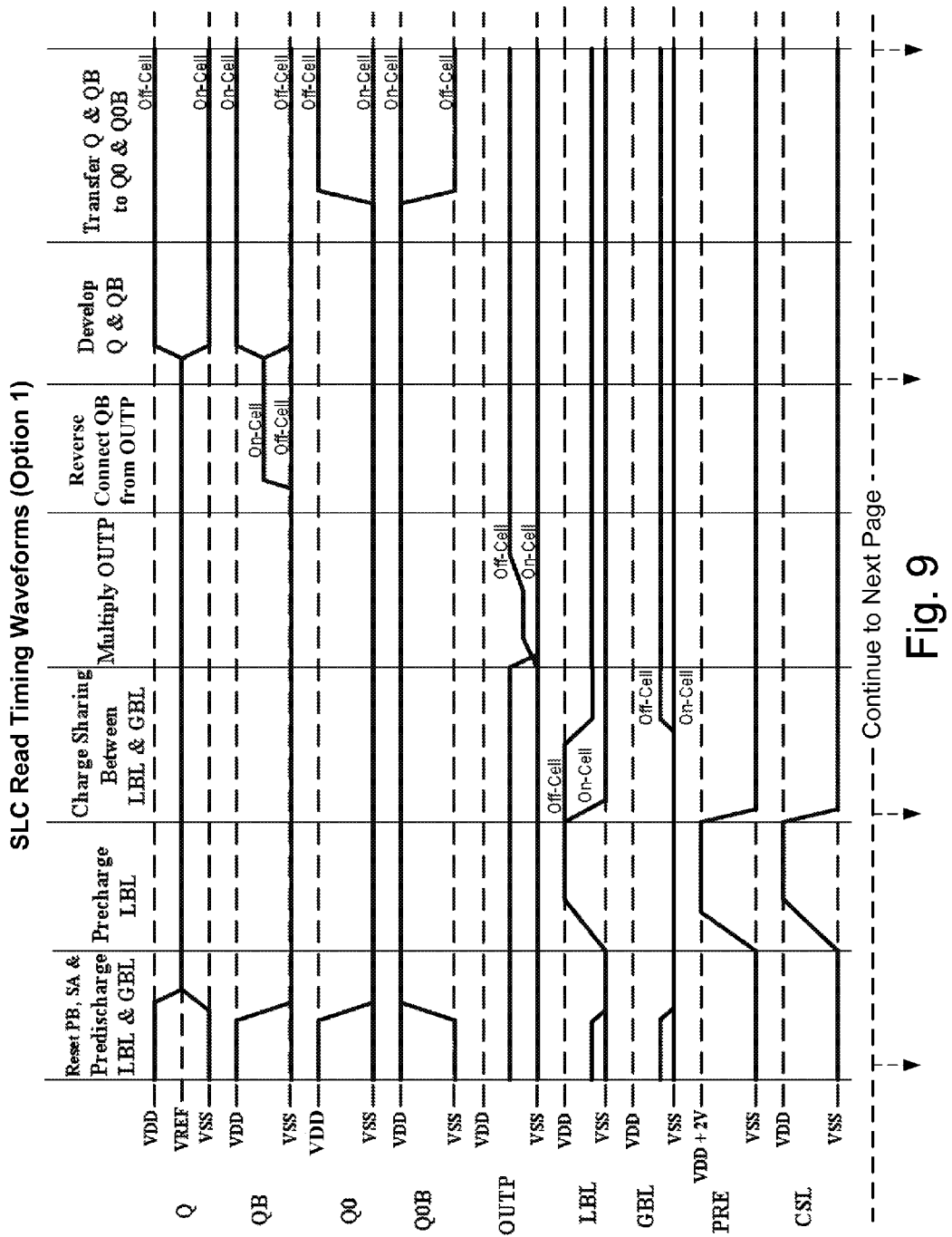
FIG. 9 shows the preferred time lines and waveforms of key control signals for properly operating the preferred Read operation of Option1 in accordance with the circuits shown in FIG. 4, FIG. 5, FIG. 6, and FIG. 7A of the HiNAND array shown in FIG. 3.
Figure 9:
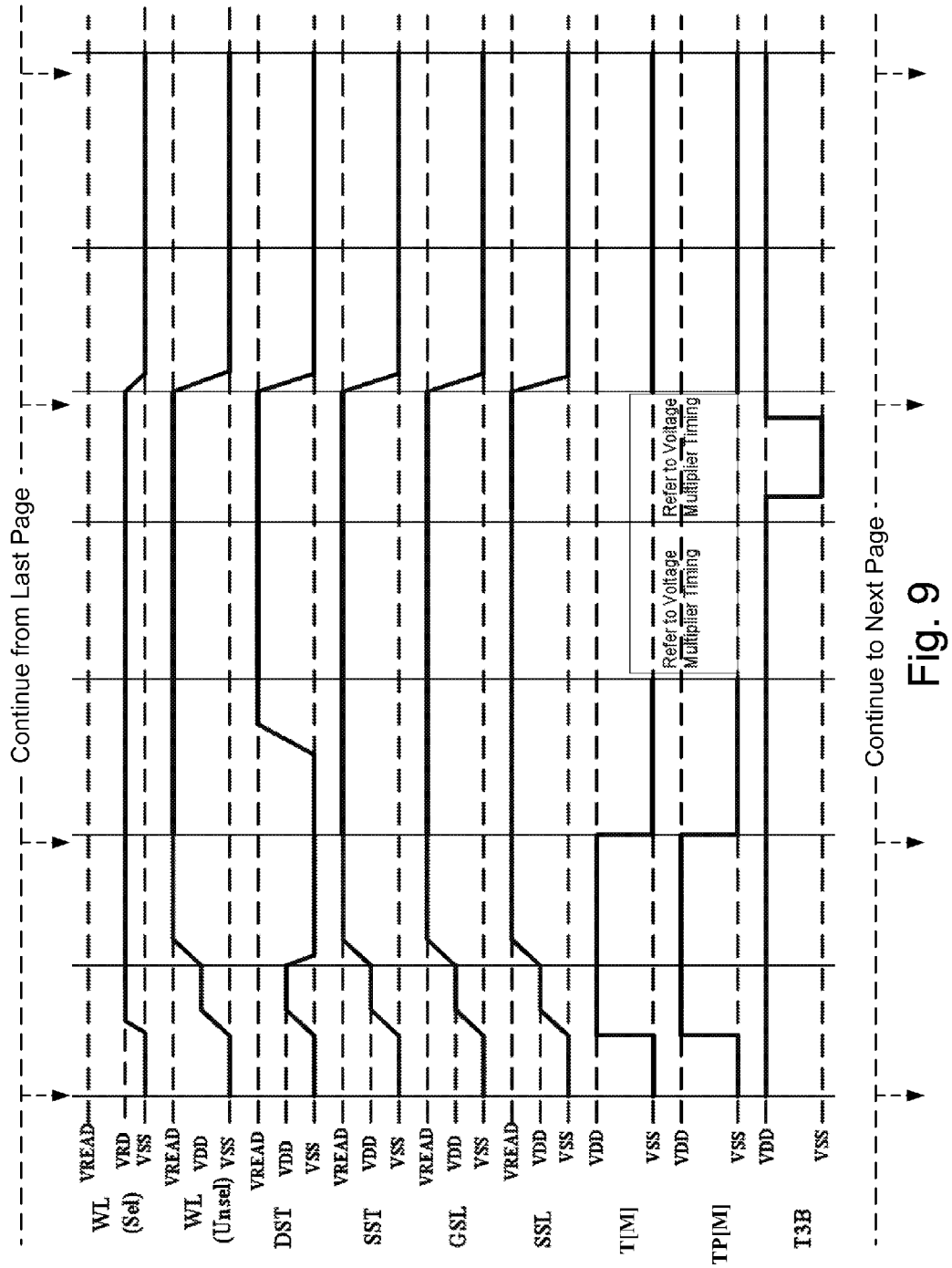
Figure 9:
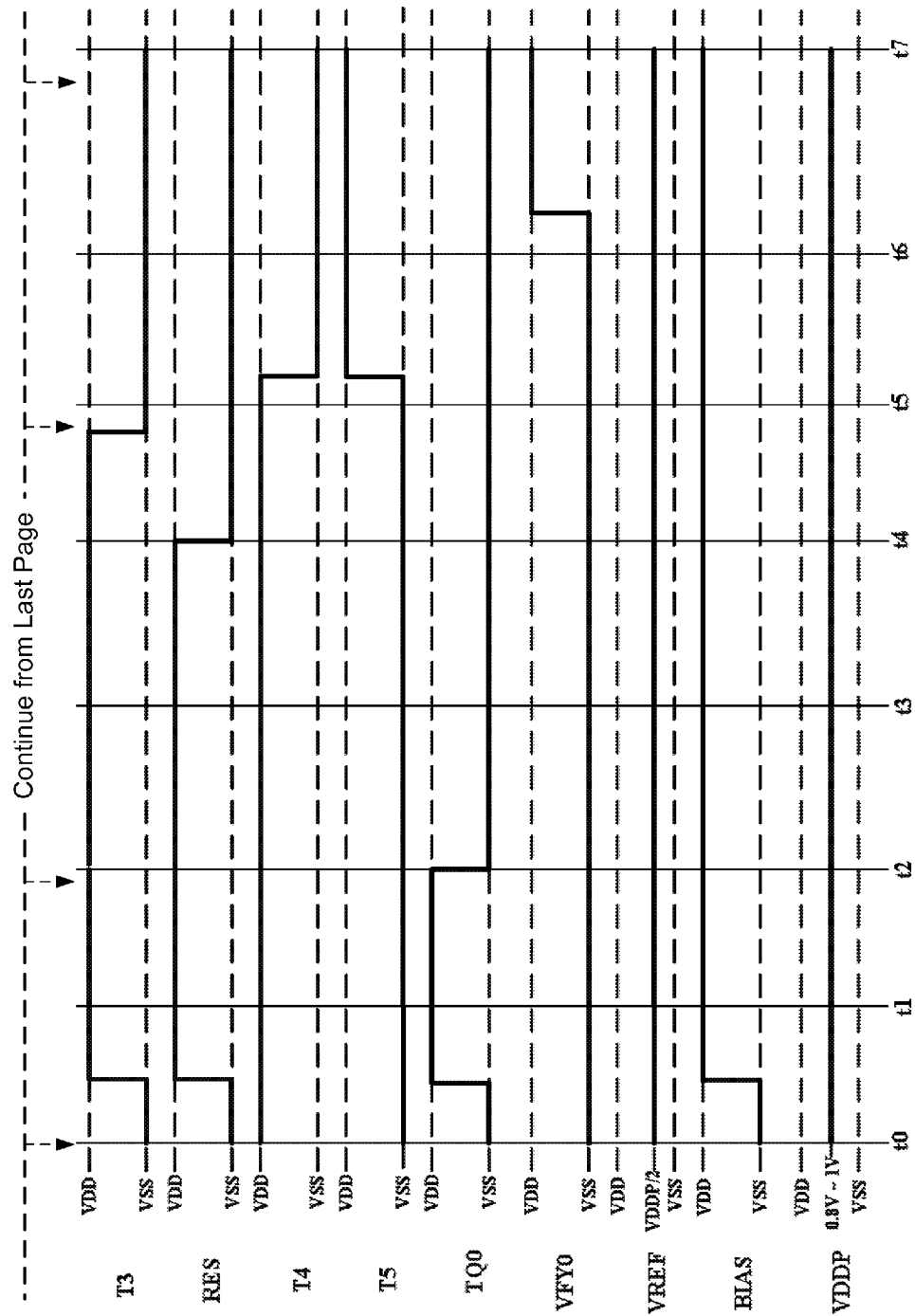

FIG. 9 shows preferred time lines and waveforms of key control signals for properly operating the preferred SLC Read operation of Option1 in accordance with the circuits shown in FIG. 4, FIG. 5, FIG. 6, and FIG. 7A of the HiNAND array shown in FIG. 3. This diagram is merely an example, which should not unduly limit the scope of the claims. One of ordinary skill in the art would recognize many variations, alternatives, and modifications.

As shown, in a preferred SLC Read operation, key control signals and their variations in association with the HiNAND array coupled with Page Buffer, Multiplier, and Latch SA per each GBL are illustrated in a time line plot. These key control signals include PRE, WL(one selected one) and WLs(31 unselected ones), DST, SST, GSL, SSL, T[M], TP[M], T3B, T3, RES, T4, T5, TQ0, VFY0, VREF, BIAS and VDDP, etc. The time line is divided from t0 to t7 into seven periods that include, Setup, Precharge LBL, Charge-sharing between LBL & GBL, Multiply to OUTP, Reverse Connect QB from OUTP, Develop Q and QB pair, and Transfer Q and QB to Q0 and Q0B as the end of Read operation. Start from a first period t0-t1 for setup, the biasing operations applied to the key control signals are summarized below:

a) Reset QB node to Vss but Q node in tri-state at VREF for each Latch.

b) Reset Page Buffer's Latch so that Q0 node is at Vss but Q0B node at Vdd.

c) Pre-discharge LBL and GBL via setting both T[M] and T[M] to Vdd and BIAS to Vdd.

d) VDDP is at 0.8~1V=$V_{BLP}$+Vtp (MP5) in FIG. 4. It is set ready before Option1 Connector circuit is selected for operation between the Multiplier circuit and the Latch SA circuit.

e) Setting GSL and SSL to VREAD>Vdd ready for HiNAND String Read operation to lower the resistance of String select transistors for a faster Read.

f) Set one selected WL voltage to $V_{RD}$.

g) Set other 31 unselected WLs voltage to VPASS=VREAD=6V.

h) Set PRE to Vss to precharge BLP to Vdd initially prior to reading.

i) Set RES to Vdd to reset QB node to Vss for Latch SAs ready before reading.

j) Set BIAS to Vdd to connect each LBL to its corresponding GBL by turning on BL 20V device MN6 (see FIG. 4).

k) Set VREF to VDDP/2 when Option1 Connector is used.

l) Set T4 to Vdd and T5 to Vss ready initially before next DRAM-like Latch development shown in FIG. 4.

The second period of t1-t2 is a LBL precharge period.

a) LBL switches from Vss to a full Vdd (e.g., of 1.8V). For 3V Vdd operation, it is preferred to still use 1.8V for power reduction in this LBL precharge cycle.

b) Set PRE to Vdd+2V to allow the full 1.8V Vdd passage from one selected CSL at Vdd to precharge a selected LBL. Non-selected CSL is set to Vss.

c) LBL is at Vdd after precharge but GBL is at Vss.

d) At the end of the precharge period, both gate signals T[M] and T[M] are applied with Vss ready for Multiplier operation before the Read starts.

e) Reduce PRE and CSL to Vss to disconnect CSL from the selected LBL in the selected Group.

f) At the end of this period, TQ[0] is at Vss to disconnected MN20 from BLP so that the next charge-sharing period happening only between LBL and GBL would not be affected by any SLC latches, regardless of Option1 or Option2 SLC Page Buffer circuits as shown in FIG. 5.

g) The Q state of Latch still remains in a high-Z state because gate T4 is at Vdd and gate T5 is at Vss.

The third period of t2-t3 is for charge-sharing between the selected LBLs of the selected Group and its corresponding GBLs.

a) LBL and GBL still are at Vss if the selected NAND cell Vt is detected below $V_{RD}$ as an On-cell that is able to discharge the precharged LBL of 1.8V to Vss.

b) But LBL and GBL are set to about 0.18V if the NAND cell Vt is above $V_{RD}$=0V as an Off-cell that cannot discharge the LBLs with a condition of Rcap=LBLcap/GBLcap≤1/10. Since LBLcap is about 1/10 of GBLcap, thus the discharge time is much faster than the GBL discharge time. For example, the discharge time is only 30% of GBL discharge time. Thus, the read-induced Vpass WL-disturbance is reduced by 70%.

c) All 31 unselected WL voltages are at VREAD=Vpass=6V which still remain before Latch to sense the right data of the selected NAND cell.

d) OUTP voltage still keeps the old value in previous Read cycle that is settled by the new Charge-sharing between each LBL and each GBL of new values determined by the new selected NAND cell's Vt state.

The fourth period of t3-t4 is Multiplier working period.

a) OUTP voltage switches from the old value in previous Read cycle to a new value that is settled by the new Charge-sharing between each LBL and each GBL of new values determined by the new selected NAND cell's Vt state. If the NAND cell is an On-cell, then OUTP changes to Vss. If it is Off-cell, then OUTP voltage becomes 3×0.18V=0.54V when Multiplier finishes the 3-step multiplier cycles to triple the sensing voltage at BLP to a new value of OUTP voltage.

b) Gates T[M] and T[M] timing control can be referred to the waveforms in FIG. 8 for a circuit of Voltage Tripler (i.e., M=3).

The fifth period of t4-t5 is for connecting QB in Latch SA from OUTP voltage of the Multiplier.

a) latching the input voltage at OUTP to QB node of a DRAM-like Latch SA if the Option1 Connector (section B of FIG. 4) is used between Multiplier and Latch SA. In other words, this step is to latch the reversed OUTP voltage to QB node of Latch SA. If OUTP is 0.54V, then PMOS device MP5 is shut off. Therefore QB node is at Vss of the initial reset voltage through the NMOS device MN7 (see Section C of FIG. 4). If OUTP is 0V, then MP5 is open to couple the VDDP voltage to QB node.

b) T3 stays at Vdd level and then switches to Vss upon the rising edge of T3B when Option1 Connector is used as seen in FIG. 4. This step is to latch the VREF at Q node for the Latch and Multiplied Sense voltage at QB node. At the end of this period, both Q and QB nodes have latched voltages with ΔV=0.27V. The VREF at Q node is chosen to be 0.27V in this case but QB node has two voltages depending by the NAND cell's Vt. The QB node is 0V of an On-cell state or QB is 0.54V of an Off-cell state.

The sixth period of t5-t6 is Development period for Q and QB of the Latch SA.

a) This is done by switching gate T4 from Vdd to Vss and gate T5 from Vss to Vdd as seen the circuit of Latch SA in section C of FIG. 4. Both can switch at the same time. For an easier design, T4 and T5 can be made from Inverter's Input to Output with the opposite polarity. The small ΔV=0.27V at Q and QB nodes initially will be developed and amplified to be Vdd and Vss or Vss and Vdd respectively at Q and QB nodes after this period.

b) When switching T4 and T5, the one-selected WL and 31 unselected WL voltages can be discharged to Vss to remove the Vpass WL disturbance.

The seventh period of t6-t7 is to transfer the final fully-developed Q and QB voltages to Q0 and Q0B of storage bits in the corresponding Page Buffer to finish the whole Read cycle of the selected HiNAND cell of the present invention.

Figure 10:
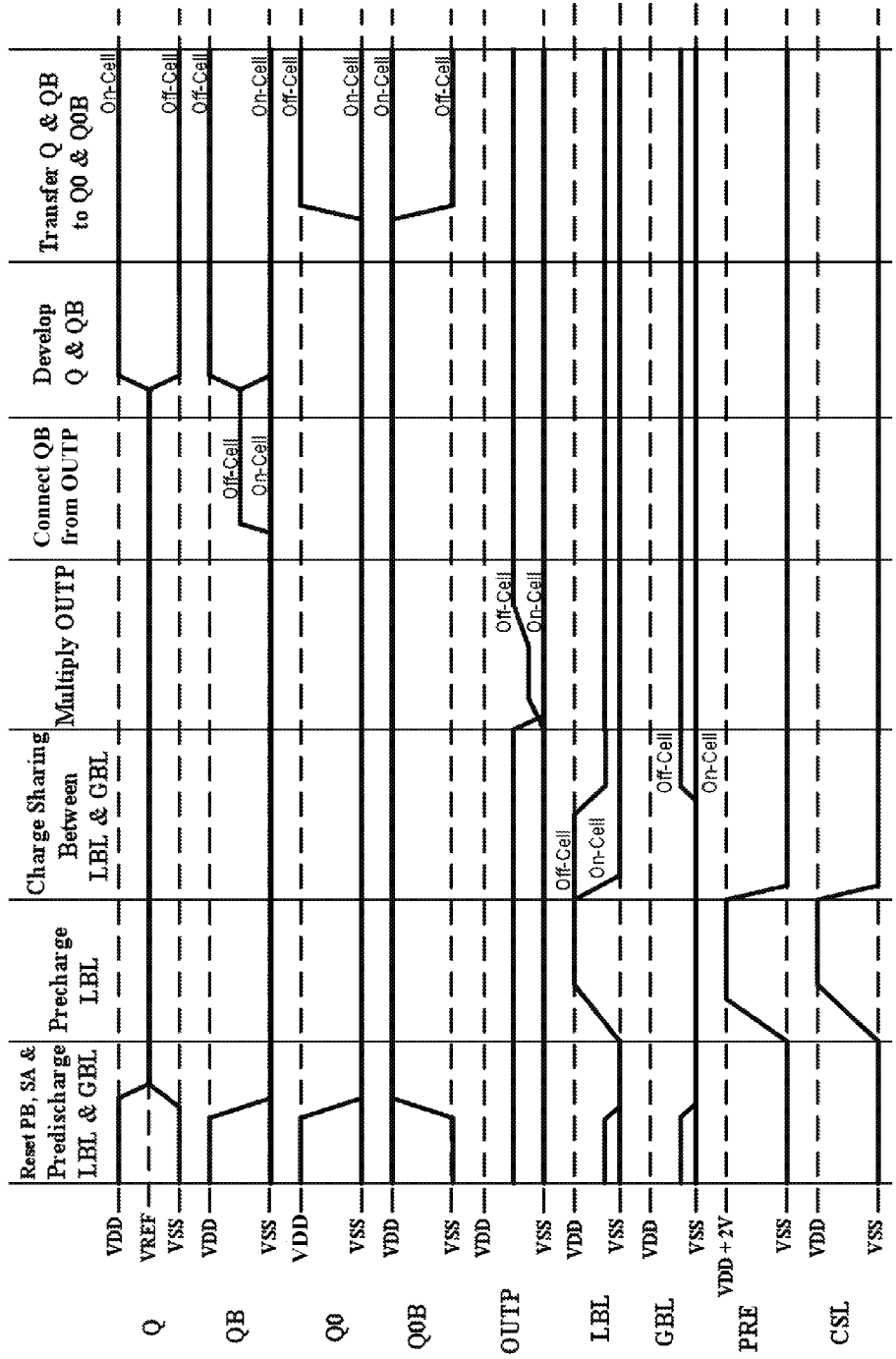
FIG. 10 shows the preferred time lines and waveforms of some key control signals for properly operating the preferred Read operation of Option2 in accordance with the circuits shown in FIG. 4, FIG. 5, FIG. 6, and FIG. 7A of the HiNAND array shown in FIG. 3.
Figure 10:
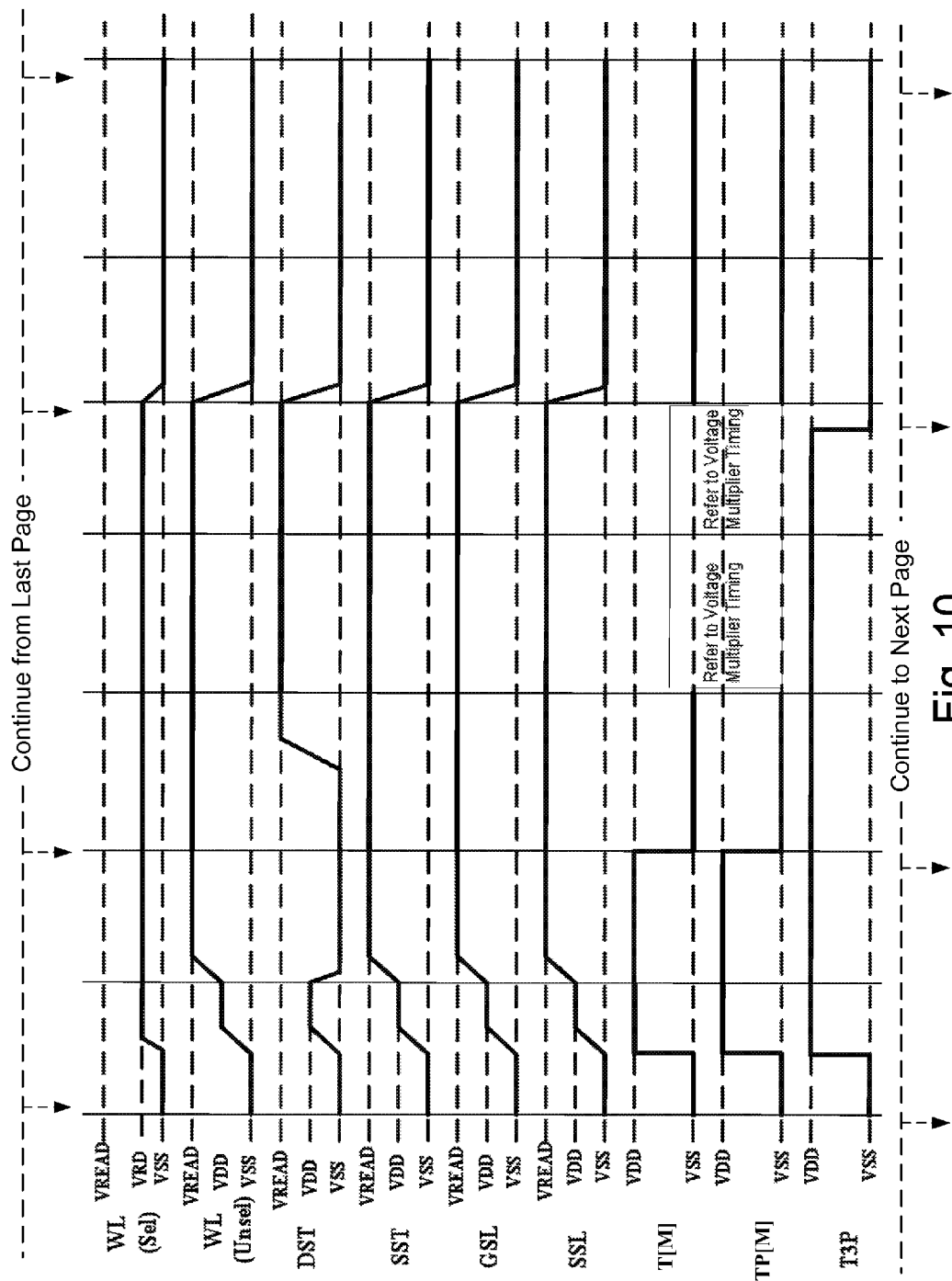
Figure 10:
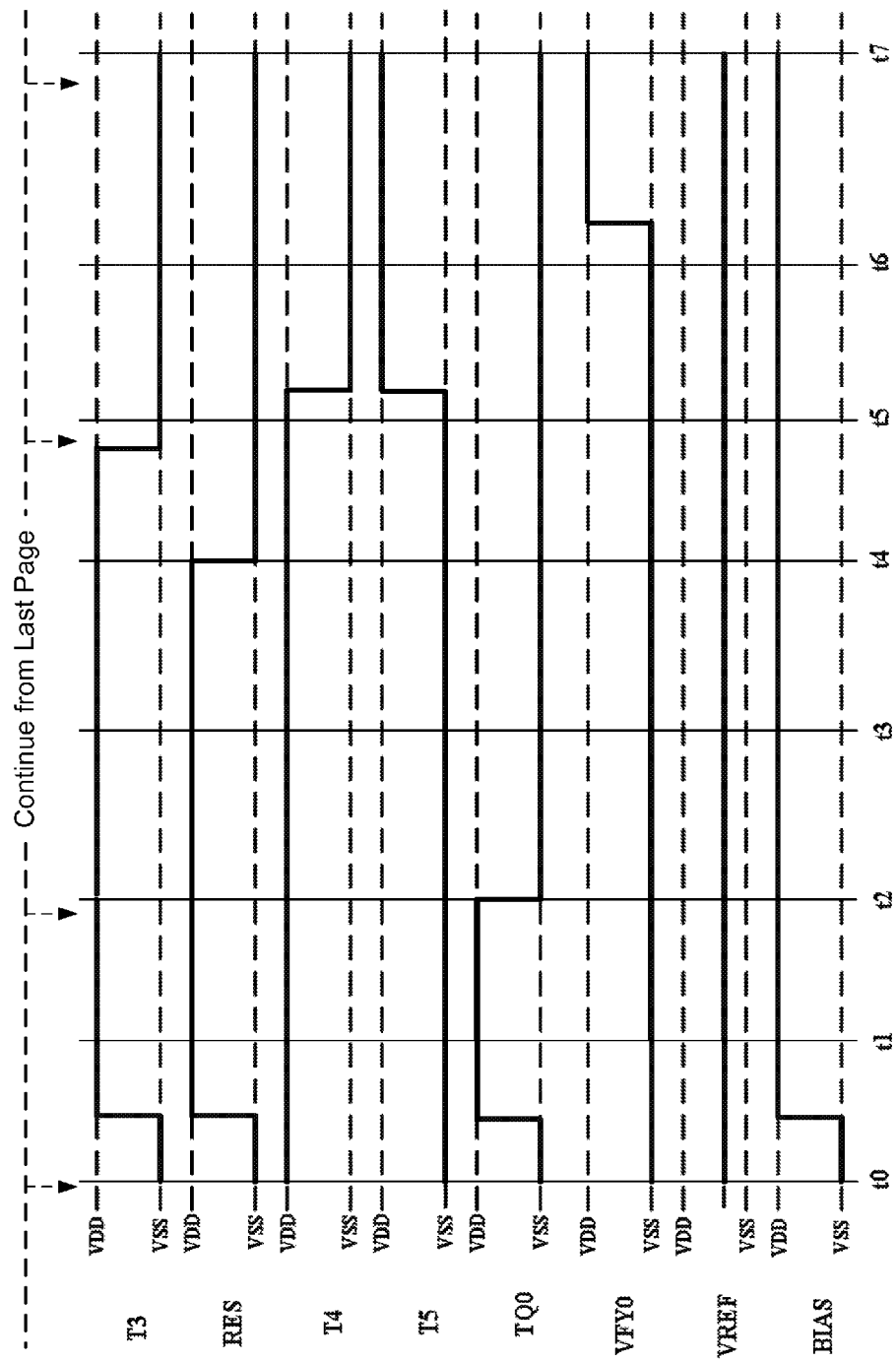

FIG. 10 shows preferred time lines and waveforms of some key control signals for properly operating the preferred SLC Read operation of Option2 in accordance with the circuits shown in FIG. 4, FIG. 5, FIG. 6, and FIG. 7A of the HiNAND array shown in FIG. 3. This diagram is merely an example, which should not unduly limit the scope of the claims. One of ordinary skill in the art would recognize many variations, alternatives, and modifications. As shown, FIG. 10 shows another set of SLC Timing Waveforms when Option2 Connector circuit is used between Multiplier and Latch SA circuit as seen in FIG. 4. Since all the control signals are the same except that one signal T3P connected to gate of the LV pass-transistor of NMOS device MN1 is included, replacing signal T3B for controlling the Option1 Connector circuit. Unlike the Option1 Connector circuit, the OUTP voltage is passed to QB node of the Latch SA circuit as a sense voltage having the same polarity and the voltage value because Vdd of 1.8V is applied at T3P which is high enough to fully pass the input OUTP voltage. Therefore, T3P stays at Vdd from the first period to the fifth period for allowing input OUTP voltage pass to QB node.

Additionally, there is no need of the VDDP voltage in this Option2 SLC Read. The signal of T3B is not used. The reference voltage VREF is set to a middle value between 0V and a sense voltage directly passed from OUTP. The rest of key control signals are the same as FIG. 9. Thus, the timing waveforms are substantially the same as the SLC Read Timing Waveforms using Option1 Connector except minor difference in controlling signal T3P not signal T3B. Thus the description is skipped here for simplicity of this application.

In an alternative embodiment, the present invention can be applied for performing Program-Verify operation based on the HiNAND array with hierarchical-BL architecture shown in FIG. 3. After a selected memory cell in a selected string of a selected Group of the HiNAND array is programmed, the operation enters a Program-Verification period which is operated substantially the same as the Read operation described above. In a specific embodiment, to verify if the selected memory cell has been properly programmed, the selected WL voltage is reset to equal to minimum threshold value of the programmed state of the cell. For SLC type storage, the minimum threshold value is about 1.0V (see FIG. 7A). Therefore, an On-state of the cell corresponds to Vt<1V, representing an non-programmed state so the Q0 node in the page buffer remains at "0". An Off-state of the cell corresponds to Vt>1V, representing that a programmed state is verified and Q0 node in the page buffer is turned into "1". Therefore, the whole times line of SLC Read operation Timing Waveforms for most key control signals shown in FIG. 9 and FIG. 10 for two connector options can be applied for Program-Verify operation of the SLC-type cells under the same HiNAND hierarchical-BL architecture shown in FIG. 3, FIG. 4, and FIG. 5.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A device with a high-density NAND (HiNAND) hierarchical-BL memory architecture for lowering disturbance, power-consumption, and latency in Read operation and Program-Verify operation, the device comprising:
a HiNAND array comprising a matrix of NAND memory cells divided by J number of Groups arranged along with a plurality of global bitlines (GBLs), J being an integer number, each Group comprising a plurality of top Group-BL-select transistors controlled by a first common gate signal for respectively connecting the plurality of GBLs to a plurality of local bitlines (LBLs) and a plurality of Group-BL-select transistors controlled by a second common gate signal for respectively connecting the plurality of LBLs to a common source line, along the plurality of LBLs each Group being divided into K number of blocks, K being an even integer number, each block comprising a plurality of strings of N memory cells connected in series having N rows, N being an integer number, each string being associated with one LBL via a string-BL-select transistor and associated with a local common source line via a string-SL-select transistor, each row of memory cells across all strings in a block being commonly gated by a word line (WL) signal, all strings in each neighboring pair of the K number of blocks sharing the same local common source line connected to the common source line via a block-SL-select transistor controlled by one of K/2 third common gate signals associated with each Group;
a first plurality of data handling/control circuits respectively coupled to odd-numbered half of the plurality of GBLs of the HiNAND array, each of the first plurality of data handling/control circuits comprising a multiplier circuit, a connector circuit, a sense amplifier circuit, and a page buffer circuit to connect to one odd-numbered GBL from the HiNAND array; and
a second plurality of data handling/control circuits respectively coupled to even-numbered half of the plurality of GBLs of the HiNAND array, the second plurality of data handling/control circuits being substantially redundant to the first plurality of data handling/control circuits;
wherein J is at least 2 to make a ratio of a length of a LBL in one Group at least smaller than a length of a GBL through all J number of Groups for keeping a LBL capacitance smaller than a conventional GBL capacitance to provide a reduced precharge voltage outputted to the GBL by charge-sharing the GBL with the LBL in the Group for achieving multi-fold reduction in discharging time for faster Read and Program-Verify operations;
wherein the multiplier circuit in each of the first and the second plurality of data handling/controlling circuits is configured to multiply the reduced precharge voltage by multi-fold before being coupled by the connector circuit to the corresponding sense amplifier circuit for properly sensing and transferring a digital signal associated with threshold states in a selected memory cell in the HiNAND array to one or more digital bits in the page buffer circuit with substantial reduction in power consumption, word-line Read and Verify disturbance, and operation latency.

2. The device of claim 1 wherein the first plurality of data handling/control circuits and the second plurality of data handling/control circuits are consolidated for performing Read and Program-Verify operations for all global bitlines regardless of odd-numbered half GBLs and even-numbered half GBLs.

3. The device of claim 1 wherein each of the top Group-BL-select transistor, the bottom Group-BL-select transistor, and each of the block-SL-select transistors in the HiNAND array circuit is a high-voltage 1-poly NMOS transistor.

4. The device of claim 1 wherein each of the string of N memory cells in the HiNAND array circuit is a high-voltage 2-poly floating-gate NMOS transistor, or an 1-poly charge-trapping MONOS or SONOS transistor.

5. The device of claim 1 wherein each of the string of N memory cells in the HiNAND array circuit is selected with pre-programmed data in different types of storages that include SLC (1 bit per cell with two threshold states), MLC (2 bits per cell with four threshold states), TLC (3 bits per cell with eight threshold states), XLC (4 bits per cell with 16 threshold states) and Analog storage that stores more than 4 bits.

6. The device of claim 1 wherein the plurality of GBLs and the plurality of LBLs are laid out as a hierarchical-BL architecture wherein each LBL of a selected Group laid as a first metal line and each corresponding GBL throughout all Groups of the HiNAND array is laid as a second metal line, the first metal line being laid out in parallel to and topologically below the second metal line, the LBL being operably coupled upward to the corresponding GBL of the selected Group via one top Group-BL-select transistor and being operably coupled downward to the common source line of the selected Group via one bottom Group-BL-select transistor, the common source line being laid out as another metal line perpendicular to and topologically below the first metal line.

7. The device of claim 1 wherein the precharge voltage is applied through the common source line independently or concurrently to one or more of the plurality of LBLs for a selected Group for either Read or Program-Verify operations, wherein when the common source line is 0V, all of the plurality of LBLs are discharged with the second common gate signal being set to Vdd, or when the common source line is a desired voltage up to breakdown voltage of the bottom Group-BL-select transistor, the plurality of LBLs are charged to the desired value with the second common gate signal being set to Vdd plus a margin at least greater than threshold voltage of the bottom Group-BL-select transistor.

8. The device of claim 1 wherein the multiplier circuit is configured to receive the reduced precharge voltage at an input node connected to a GBL from the HiNAND array via a NMOS pass transistor controlled by a bias signal and to multiply the reduced precharge voltage M-fold as an output voltage at an output node using a M-stage circuit comprising M number of capacitors connected in series, M being an integer larger than 1, each capacitor being coupled with a first pass transistor connected between the input node and a common node and a second pass transistor connected between ground and the common node, wherein a first of the M number of capacitors further being coupled with one additional pass transistor connected between the input node and the output node.

9. The device of claim 8 wherein the multiplier circuit is a voltage doubler with the output voltage at the output node being multiplied by 2-fold from the reduced precharge voltage at the input node if M=2.

10. The device of claim 8 wherein the multiplier circuit is a voltage tripler with the output voltage at the output node being multiplied by 3-fold from the reduced precharge voltage at the input node if M=3.

11. The device of claim 1 wherein the connector circuit comprises two PMOS pass transistors connected in series to connect an output node of the multiplier circuit to a gate of one PMOS pass transistor and its source node connected to a first input node of the sense amplifier circuit for converting an output voltage at the output node of the multiplier circuit to a sensing voltage with a revered polarity.

12. The device of claim 1 wherein the connector circuit alternatively comprises one NMOS pass transistor connected between an output node of the multiplier circuit to a first input node of the sense amplifier for directly passing an output voltage at the output node of the multiplier circuit to a sensing voltage with the same polarity at the first input node of the sense amplifier circuit.

13. The device of claim 1 wherein the sense amplifier circuit comprises a first output node receiving a sensing voltage from the HiNAND array latched from the multiplier through the connector circuit and a second output node receiving a reference voltage latched from a pass transistor to develop a voltage difference ΔV into a single high/low voltage level at either the first output node or the second output node depending on single On/Off states corresponding to two threshold levels of a selected memory cell of SLC type detected by applying a single check voltage to a selected WL of the selected memory cell or to develop a voltage difference ΔV into four combinations of high/low voltage levels at either the first output node or the second output node depending on four combinations of On/Off states corresponding to four threshold levels of a selected memory cell of MLC type detected by applying three check voltages in step-rising manner to a selected WL of the selected memory cell.

14. The device of claim 13 wherein the single check voltage is a $V_{RD}$ voltage between two threshold levels of an Erased State and a Programmed State of the selected memory cell of SLC type during a Read operation and alternatively is a minimum threshold voltage of the Programmed State of the selected memory cell of SLC type during a Program-Verify operation.

15. The device of claim 13 wherein the three check voltages are three step-rising $V_{RD}$ voltages respectively between two neighboring threshold levels of an Erased State, a first Programmed State, a second Programmed State, and a third Programmed State of the selected memory cell of MLC type during a Read operation and alternatively are three minimum threshold voltages of the corresponding the first, the second, and the third Programmed States of the selected memory cell of MLC type during a Program-Verify operation.

16. The device of claim 13 wherein the page buffer circuit comprises a SLC-type page buffer having one latch data node operably connected to the first output node of the sense amplifier circuit, if the connector circuit comprises one NMOS pass transistor acted as an isolator, to transfer the single high/low voltage level at the first output node of the sense amplifier to one digital bit represented by one high/low voltage level at another latch data node of the SLC-type page buffer.

17. The device of claim 13 wherein the page buffer circuit comprises a SLC-type page buffer having one latch data node operably connected to the second output node of the sense amplifier circuit, if the connector circuit comprises two PMOS pass transistors acted as an invertor, to transfer the single high/low voltage level at the second output node of the sense amplifier to one digital bit represented by a high/low voltage level at another latch data node of the SLC-type page buffer.

18. The device of claim 13 wherein the page buffer circuit comprises a MLC-type page buffer with two latches each having a first data node operably connected to the first output node of the sense amplifier circuit, if the connector circuit comprises one NMOS pass transistor acted as an isolator, to transfer the four combinations of high/low voltage levels at the first output node of the sense amplifier to two digital bits represented by four combinations of high/low voltage levels at two second data nodes of the two latches.

19. The device of claim 13 wherein the page buffer circuit comprises a MLC page buffer with two latches each having a first data node operably connected to the second output node of the sense amplifier circuit, if the connector circuit comprises two PMOS pass transistors acted as an invertor, to transfer the four combinations of high/low voltage levels at to two digital bits represented by four combinations of high/low voltage levels at two second data nodes of the two latches.

20. A method for performing NAND Read operation and Program-Verify operation upon a selected memory cell configured in a high-density NAND (HiNAND) hierarchical-BL architecture, the method comprising:
configuring a HiNAND memory array having a plurality of columns respectively associated with a plurality of global bit lines (GBLs) to divide each column of memory cells into J number of Groups each being associated a local bit line (LBL), J being an integer number greater than 1;
configuring a high-voltage NMOS transistor controlled by a bias signal to connect each of the plurality of GBLs to a multiplier and a page buffer;
configuring the multiplier with a M-stage multiplication circuit for multiplying a voltage value by number M, M being an integer greater than 1;
configuring a connector to couple an output voltage from the multiplier to latch a sensing voltage to a latch sense amplifier coupled between the connector and the page buffer;

resetting the page buffer and the latch sense amplifier to predischarge a GBL and a LBL associated with the GBL, the LBL corresponding to a selected Group from the J number of Groups in the HiNAND memory array;

precharging the LBL to Vdd charge for a selected string in the selected Group with a selected memory cell while keeping the GBL to Vss=0V;

sharing the Vdd charge of the LBL with the GBL to couple an bitline voltage at the GBL with a high value reduced to about 1/(J+1) of Vdd or lower for an Off-state of the selected memory cell or a low value substantially equal to zero for an On-state of the selected memory cell;

multiplying the bitline voltage by number M through the multiplier to provide an output voltage;

coupling a sensing voltage associated with the output voltage through the connector to the latch sense amplifier followed by coupling a reference voltage to the latch sense amplifier, the sensing voltage and the reference voltage having a voltage difference;

developing the voltage difference by the latch sense amplifier to a digital signal; and configuring the page buffer to transfer the digital signal into a digital bit in the page buffer corresponding to multiple threshold states of the selected memory cell.

21. The method of claim 20 wherein configuring a HiNAND memory array further comprises arranging each of the J number of Groups with a plurality of top Group-BL-select transistors controlled by a first common gate signal for respectively connecting the plurality of GBLs to a plurality of local bit lines (LBLs) and a plurality of bottom Group-BL-select transistors controlled by a second common gate signal for respectively connecting the plurality of LBLs to a common source line, along the plurality of LBLs each Group being divided into K number of blocks, K being an even integer number, each block comprising a plurality of strings of N memory cells connected in series having N rows, N being an integer number, each string of N memory cells being associated with one LBL via a string-BL-select transistor and associated with a local common source line via a string-SL-select transistor, each row of memory cells across all strings in a block being commonly gated by a word line (WL) signal, all strings in each neighboring pair of the K number of blocks sharing the same local common source line connected to the common source line via a block-SL-select transistor controlled by one of K/2 third common gate signals associated with each Group.

22. The method of claim 21 further comprising discharging the LBL's stored charges through the selected string at least J-fold faster than discharging a GBL in a conventional NAND array, due to that a corresponding LBL capacitance is substantially smaller than a conventional GBL capacitance because a length of the LBL is designed to be about 1/J or less of a length of the conventional GBL in the conventional NAND array.

23. The method of claim 20 wherein configuring the multiplier comprises connecting a first NMOS pass transistor between an input node and an output node of a M-stage multiplication circuit, M being an integer greater than 1, each stage of the M-stage multiplication circuit comprising one capacitor coupled to a second NMOS pass transistor and a third NMOS pass transistor, the second NMOS pass transistor connecting between the input node and a common node, the third NMOS pass transistor connecting between the common node and ground the input node receiving the bitline voltage and the output node outputting the output voltage.

24. The method of claim 23 wherein multiplying the bitline voltage comprises, charging the capacitor in a first stage of the M-stage multiplication circuit to the bitline voltage by applying Vdd to gate of the first NMOS pass transistor connected to the input node with the bitline voltage;

coupling Vss to gate of the second NMOS pass transistor connected between the input node and the capacitor in a second stage of the M-stage multiplication circuit;

grounding the common node of the capacitor in the first stage to 0V by turning on the third NMOS pass transistor; and charging the capacitor in the second stage to the bitline voltage by grounding the common node of the capacitor in the second stage to 0V while isolating the capacitor in the first stage charged with the bitline voltage;

continuing to charge the capacitor in next stage until the capacitor in the Mth stage of the M-stage multiplication circuit is charged to the bitline voltage to produce the output voltage at the output node equal to M times the bitline voltage;

wherein each capacitor in every stage of the multiplier is made substantially a same capacity.

25. The method of claim 20 wherein configuring a connector comprises connecting a first PMOS transistor in series to a second PMOS transistor, the first PMOS transistor having a gate control signal and a drain signal and the second PMOS transistor having a gate connected to the output voltage of the multiplier to couple the sensing voltage having a reversed polarity of the output voltage to the latch sense amplifier.

26. The method of claim 25 wherein developing the voltage difference by the latch sense amplifier to a digital signal comprises, configuring the latch sense amplifier with a first output node connected to the connector to receive the sensing voltage having the revered polarity of the output voltage and a second output node coupled to a NMOS transistor to receive the reference voltage having the voltage difference from the sensing voltage;

configuring the latch sense amplifier with a first input node coupled to a first latch signal and a second input node coupled to a second latch signal;

pulsing the first latch signal and the second latch signal with reversed polarity to amplify the voltage difference to one or more combinations of Vdd or Vss level respectively at either the first output node or the second output node representing an one-bit digital signal corresponding to two threshold states in the selected memory cell of SLC type stored in the HiNAND array or a two-bit digital signal corresponding to four threshold states in the selected memory cell of MLC type stored in the HiNAND array.

27. The method of claim 26 wherein developing the voltage difference by the latch sense amplifier to a digital signal comprises, configuring the latch sense amplifier with a first output node connected to the connector to receive the sensing voltage having the same polarity of the output voltage and a second output node coupled to a NMOS transistor to receive the reference voltage having the voltage difference from the sensing voltage;

configuring the latch sense amplifier with a first input node coupled to a first latch signal and a second input node coupled to a second latch signal;

pulsing the first latch signal and the second latch signal with reversed polarity to amplify the voltage difference to one or more combinations of Vdd or Vss level respectively at either the first output node or the second output node representing an one-bit digital signal corresponding to two threshold states in the selected memory cell of SLC type stored in the HiNAND array or a two-bit digital signal corresponding to four threshold states in the selected memory cell of MLC type stored in the HiNAND array.

28. The method of claim 27 wherein configuring the page buffer comprises
providing an one-latch circuit having a first data node and a second data node;
resetting the second data node to Vss and the first data node to Vdd;
coupling the first data node of the one-latch circuit to the first output node of the latch sense amplifier;
transferring the one-bit digital signal at the first output node of the latch sense amplifier to the first data node with a reversed polarity; and
latching a digital bit at the second data node with the same polarity as the one-bit digital signal.

29. The method of claim 27 wherein configuring the page buffer alternatively comprises
providing a two-latch circuit including a first latch coupled to a second latch, each of the first latch and the second latch comprising a first data node and a second data node;
coupling the first data node of each latch being operably connected to the first output node of the latch sense amplifier;
resetting the two-latch circuit to make the second data node for each latch at Vss and the first data node for each latch at Vdd;
transferring the two-bit digital signal at the first output node of the latch sense amplifier to two digital bits at the second data nodes of the first latch and the second latch.

30. The method of claim 26 wherein configuring the page buffer comprises,
providing an one-latch circuit having a first data node and a second data node;
resetting the second data node to Vss and the first data node to Vdd;
coupling the first data node to the second output node of the latch sense amplifier;
transferring the one-bit digital signal at the second output node of the latch sense amplifier to the first data node with a revered polarity; and
latching a digital bit at the second data node with the same polarity of the one-bit digital signal.

31. The method of claim 26 wherein configuring the page buffer alternatively comprises
providing a two-latch circuit including a first latch coupled to a second latch, each of the first latch and the second latch comprising a first data node and a second data node;
coupling the first data node of each latch to the second output node of the latch sense amplifier;
resetting the two-latch circuit to make the second data node for each latch at Vss and the first data node for each latch at Vdd;
transferring the two-bit digital signal at the second output node of the latch sense amplifier to two digital bits at the second data nodes of the first latch and the second latch.

32. The method of claim 20 wherein configuring a connector alternatively comprises connecting a NMOS transistor directly from the multiplier to the latch sense amplifier to convert the output voltage to the sensing voltage having the same polarity of the output voltage.

33. The method of claim 21 wherein precharging the LBL to Vdd charge comprises setting the common source line to the Vdd level or greater and turning on the bottom Group-BL-select transistor by setting the second common gate signal to at least a level of Vdd plus about 2V margin.

* * * * *